US012645149B2

(12) United States Patent
Becker et al.

(10) Patent No.: US 12,645,149 B2
(45) Date of Patent: Jun. 2, 2026

(54) MULTI-MIRROR ARRAY

(71) Applicant: Carl Zeiss SMT GmbH, Oberkochen (DE)

(72) Inventors: Moritz Becker, Aalen (DE); Yanko Sarov, Aalen (DE); Udo Dinger, Oberkochen (DE); Dirk Ehm, Beckingen (DE); Fabian Haacker, Aalen (DE); Stefan Wolfgang Schmidt, Mettlach (DE); Achim Schöll, Kitzingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 195 days.

(21) Appl. No.: 18/626,946

(22) Filed: Apr. 4, 2024

(65) Prior Publication Data

US 2024/0248408 A1 Jul. 25, 2024

Related U.S. Application Data

(63) Continuation of application No. PCT/EP2022/076274, filed on Sep. 21, 2022.

(30) Foreign Application Priority Data

Oct. 14, 2021 (DE) .......................... 102021211619.1

(51) Int. Cl.
*G03F 7/00* (2006.01)
(52) U.S. Cl.
CPC .......... *G03F 7/702* (2013.01); *G03F 7/70316* (2013.01)
(58) Field of Classification Search
CPC .............. G02B 26/0858; G02B 5/0891; G02B 26/0841; G02B 26/0833; G02B 5/09;
(Continued)

(56) References Cited

U.S. PATENT DOCUMENTS

| 6,573,978 B1 | 6/2003 | McGuire, Jr. |
| 6,906,848 B2 | 6/2005 | Aubuchon |

(Continued)

FOREIGN PATENT DOCUMENTS

| DE | 102008009600 A1 | 8/2009 |
| DE | 102013201509 A1 | 8/2013 |

(Continued)

OTHER PUBLICATIONS

Office action in Japanese Appln. No. 2024-522397, mailed on Apr. 15, 2025, 9 pages (with English translation).
(Continued)

*Primary Examiner* — Irakli Kiknadze
(74) *Attorney, Agent, or Firm* — Fish & Richardson P.C.

(57) ABSTRACT

A multi-mirror array comprises a carrier structure and a multiplicity of mirror units arranged next to one another in a grid arrangement on the carrier structure. Each mirror unit comprises a base element and a mirror element. Each mirror element is mounted individually movably relative to the base element. Each mirror element has a mirror substrate, which, on a front surface facing away from the base element, bears a reflection coating, which can be designed for EUV radiation or for DUV radiation. The mirror surfaces are arranged next to one another to substantially fill the surface area. Between directly adjacent mirror elements there is a gap delimited by side surfaces of the adjoining mirror substrates to ensure a collision-free relative movement of the adjacent mirror elements.

21 Claims, 14 Drawing Sheets

(58) Field of Classification Search

CPC .... G02B 7/182; G02B 26/0825; G02B 5/281; G02B 1/11; G02B 5/283; G02B 5/1838; G03F 7/702; G03F 7/70983; G03F 7/70316; G03F 7/7015; G03F 7/70058; G03F 7/70191; G03F 7/70116; G03F 7/70075; G03F 7/70825; G03F 7/70525; G03F 7/70508; G03F 7/70291; G03F 7/70233; G03F 7/70266; G03F 7/70833; G03F 7/7095; G03F 7/70908; G03F 7/70933; G03F 7/70575; G03F 7/70308; G03F 7/70008; G03F 7/70916; G03F 7/70033; G03F 7/70841; G03F 7/70108; G03F 7/70166; G03F 7/70083; G01N 2021/95676; G21K 2201/065; G21K 1/062; G21K 1/067; G21K 2201/061; G21K 2201/067; G21K 1/02; G21K 1/06; H05G 2/009; H05G 2/0094; H05G 2/0092; H05G 2/0086; H05G 2/0088; H05G 2/002; B82Y 10/00; F28D 15/0266

USPC ......................................................... 378/34

See application file for complete search history.

(56) References Cited

U.S. PATENT DOCUMENTS

| | | | |
|---|---|---|---|
| 7,068,415 B2 | 6/2006 | Mushika | |
| 7,362,413 B2 | 4/2008 | Kremer et al. | |
| 8,767,176 B2 | 7/2014 | Bleidistel et al. | |
| 10,078,271 B2 | 9/2018 | Waldis et al. | |
| 10,261,424 B2 | 4/2019 | Dinger et al. | |
| 11,022,893 B2 | 6/2021 | Ehm et al. | |
| 11,789,367 B2 | 10/2023 | Anderk et al. | |
| 2006/0132747 A1 | 6/2006 | Singer et al. | |

| | | | |
|---|---|---|---|
| 2009/0097094 A1* | 4/2009 | Tanaka ................. | G03F 7/7085 359/239 |
| 2011/0146663 A1 | 6/2011 | Ezawa et al. | |
| 2014/0218708 A1 | 8/2014 | Werber et al. | |
| 2014/0293255 A1* | 10/2014 | Pnini-Mittler ........ | G02B 7/182 359/865 |
| 2017/0363861 A1 | 12/2017 | Hauf et al. | |
| 2018/0074303 A1 | 3/2018 | Schwab | |
| 2018/0196350 A1* | 7/2018 | Bieling .............. | G03F 7/70158 |
| 2022/0283428 A1 | 9/2022 | Haspeslagh et al. | |

FOREIGN PATENT DOCUMENTS

| | | | |
|---|---|---|---|
| DE | 102015204874 A1 | 9/2016 | |
| DE | 102015221209 A1 | 5/2017 | |
| DE | 102016206202 A1 | 5/2017 | |
| DE | 102019214269 A1 | 3/2021 | |
| EP | 1 614 008 B1 | 4/2004 | |
| JP | 2006-165581 A | 6/2006 | |
| JP | 2006-518884 A | 8/2006 | |
| JP | 2012-504323 A | 2/2012 | |
| JP | 2014-533441 A | 12/2014 | |
| WO | WO 2003/065103 A1 | 8/2003 | |
| WO | WO 2017/072195 A1 | 5/2017 | |
| WO | WO 2021/032483 A1 | 2/2021 | |

OTHER PUBLICATIONS

Translation of International Search Repot for corresponding PCT Appl No. PCT/EP2022/076274, dated Jan. 18, 2023.

R Li, Y Lamy, W F A Besling, F Roozeboom, P M Sarro, "Continuous deep reactive ion etching of tapered via holes for three-dimensional integration", J. Micromech. Microeng. 18 (2008) 125023 doi:10.1088/0960-1317/18/12/125023.

German Office Action, with translation thereof, for corresponding DE Appl No. 102021211619.1, dated Apr. 14, 2022.

* cited by examiner

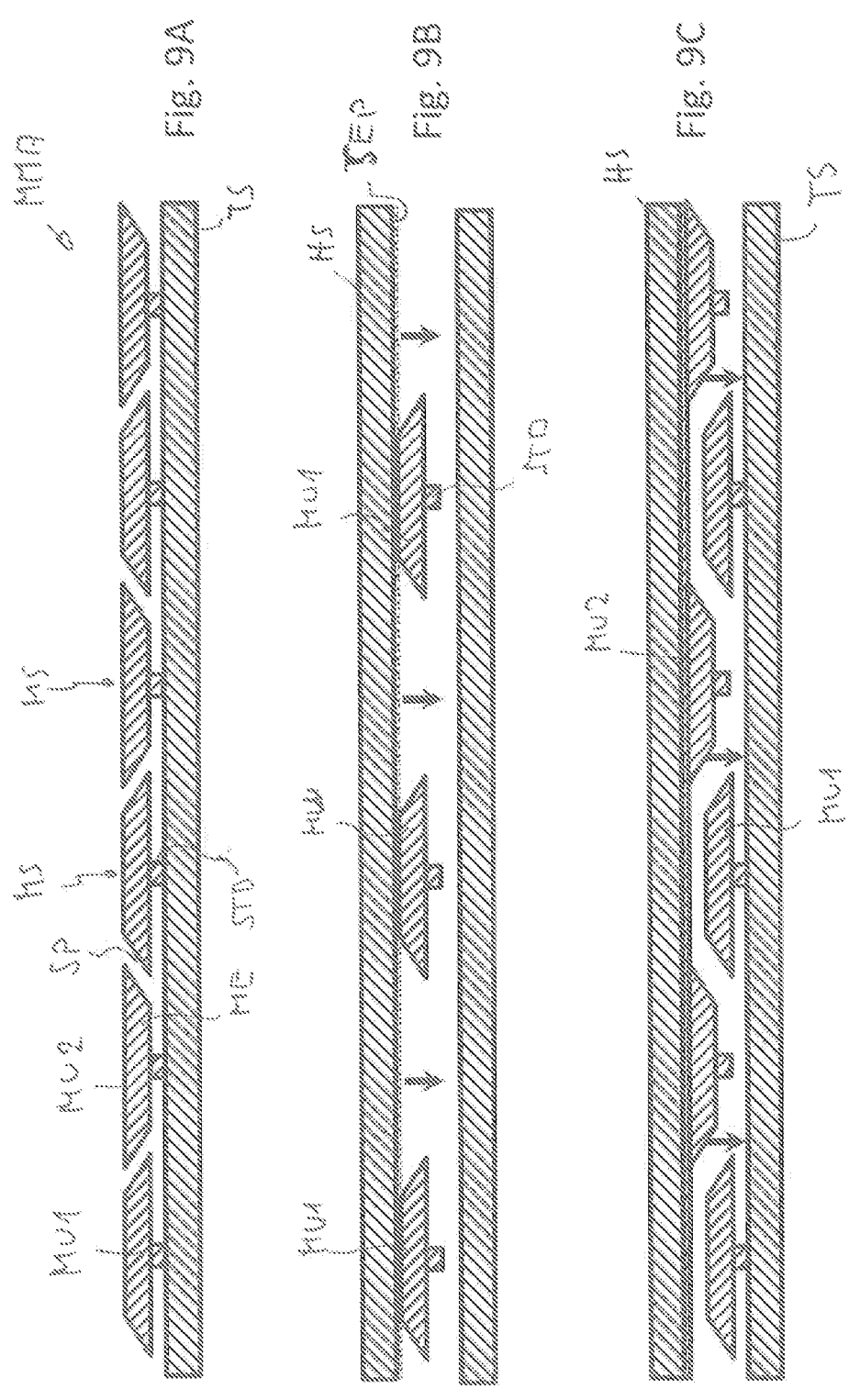

FIG. 13

MULTI-MIRROR ARRAY

CROSS-REFERENCE TO RELATED APPLICATIONS

The present application is a continuation of, and claims benefit under 35 USC 120 to, international application No. PCT/EP2022/076274, filed Sep. 21, 2022, which claims benefit under 35 USC 119 of German Application No. 10 2021 211 619.1, filed Oct. 14, 2021. The entire contents of each of these applications is incorporated by reference herein.

FIELD

The disclosure relates to a multi-mirror array and to an illumination system for an apparatus comprising at least one such multi-mirror array. A field of application is found in the area of EUV apparatuses, i.e. apparatuses using operating wavelengths from the extreme ultraviolet (EUV) range.

BACKGROUND

These days, microlithographic projection exposure methods are predominantly used for producing semiconductor components and other finely structured components. Here, use is made of masks (reticles) or other pattern generating devices, which carry or form the pattern of a structure to be imaged, for example a line pattern of a layer of a semiconductor component. The pattern is illuminated with the aid of an illumination system which forms, from the radiation of a primary radiation source, illumination radiation that is directed at patterns, is characterized by specific illumination parameters, and is incident on the pattern within an illumination field having a defined shape and size. The radiation modified by the pattern travels through a projection lens which images the pattern onto the substrate to be exposed, which is coated with a radiation-sensitive layer.

Many current microlithographic projection exposure methods and apparatuses utilize radiation from the relatively short wavelength part of the ultraviolet range (UV range), in particular radiation at wavelengths of less than 260 nm. These include inter alia systems with operating wavelengths from the deep ultraviolet (DUV) range, for example at approx. 248 nm or approx. 193 nm, which can be used to create many mid-critical structures. On occasion, the wavelength range below approx. 200 nm down to the EUV range is also referred to as vacuum ultraviolet (VUV) range.

In order to be able to produce ever finer structures, in recent years optical systems have been developed which obtain high resolution capabilities substantially using the short wavelength of the electromagnetic radiation used from the extreme ultraviolet range (EUV), for example with operating wavelengths in the range of between 5 nm and 30 nm. In general, EUV radiation cannot be focused or guided with the aid of refractive optical elements, since the short wavelengths are absorbed by the known optical materials that are transparent at higher wavelengths. Therefore, mirror systems are commonly used in EUV apparatuses, e.g. for EUV lithography.

Depending on the type of structures to be imaged, different illumination modes (also is referred to as illumination settings) which can be characterized by different local intensity distributions of the illumination radiation in a pupil plane of the illumination system are typically used. In order to be able to set these flexibly, an illumination system has a pupil shaping unit for receiving radiation from the primary radiation source and for producing a variably settable two-dimensional intensity distribution in the pupil area of the illumination system.

Some concepts provide for the use of at least one controllable multi-mirror array (MMA) in the pupil shaping unit, the multi-mirror array comprising a multiplicity of individual mirror elements which are carried by a joint carrier structure and can be tilted independently of one another in order to modify the angle distribution of the radiation incident on the totality of the mirror elements in a targeted manner such that this results in the desired spatial illumination intensity distribution in the pupil plane. The mirror surfaces are substantially arranged in an area-filling manner. A gap delimited by mirror substrate side surfaces and serving to ensure a collision-free relative movement of the mirror elements remains between immediately adjacent mirror elements. Such multi-mirror arrays are frequently also referred to as facet mirrors, with the reflective front sides of the mirror elements forming the facets.

In order to be able to set the geometric reflection properties of a controllable multi-mirror array in a targeted manner, the latter as a rule has, for each mirror element, an actuator system coupled to the mirror element for controllably modifying the pose of the mirror element in relation to the carrier structure which carries the mirror elements. Actuation movements of the actuator system are controlled by way of a control unit assigned to the multi-mirror array. Under control device control, it is possible to modify the orientation of the mirror surface of the mirror element in a targeted manner proceeding from the zero position.

A frequent target lies in a further reduction in the size of the individually settable mirror surfaces, in order to be able to set the geometric-optical reflection properties of the MMA with a high spatial resolution. Then, for production purposes, technologies from the field of producing micro-electromechanical systems (abbreviated: MEMS) are frequently repeatedly used in order to create drive elements, sensor elements, and mechanical elements as MEMS structures in the region between the mirror surface and the carrying structure.

US 2017/363861 A1 (corresponding to DE 10 2015 204 874 A1) describes a displacement device for pivoting a mirror element, produced with MEMS technology, with two degrees of freedom of pivoting. This displacement device comprises an electrode structure with actuator electrodes, which are designed as comb electrodes, which are arranged in a single plane and form a direct drive for pivoting the mirror element. For example, other examples of MMAs with MEMS mirror elements are disclosed in U.S. Pat. No. 10,261,424 B2, DE 10 2013 201 509 A1 or WO 2021/032483 A1.

The operation of an EUV apparatus with high-energy EUV radiation may, due to the underlying fundamental principles, lead to appearances of degradation in the EUV apparatus. WO 2017/072195A1 (corresponding to DE 10 2015 221 209 A1) describes that e.g. contaminating substances are created in an EUV light source, in which tin droplets are used to create the EUV radiation. These are converted into a plasma state via a laser beam, whereby the tin droplets evaporate in part, giving rise to tin particles which spread out in the EUV lithography apparatus and are deposited either directly or in the form of a layer of tin on the optical surface of optical elements, for example in the illumination system or in the projection system, and also on mechanical or mechatronic component parts of the EUV lithography apparatus. Tin contaminations can also be caused by outgassing effects on tin-contaminated components in the EUV lithography apparatus that are induced by hydrogen or a hydrogen plasma present in the EUV lithography apparatus. To protect the individual mirrors of an MMA produced with the aid of MEMS techniques, a protective element is described, the latter comprising a membrane which is carried by a frame with a grid-like structure and which is formed by a plurality of membrane segments which each protect a portion of the surface of the MMA, e.g. a group of adjacent mirror elements, from the contaminating substances. The membrane carried by the frame is arranged at a distance in front of the mirror surfaces.

DE 10 2016 206 202 A1 describes an optical assembly having a multi-mirror array. To avoid contaminations of the mirror elements with tin particles originating from the EUV radiation source and other contaminating substances, the optical assembly comprises a purge device for creating a purge gas flow which travels through a gap between the mirror bodies of at least two adjacent individual mirrors, wherein the purge gas flow is aligned in the direction of the radiation entrance side of the mirror bodies from a second side of the mirror bodies facing the carrier structure.

Document US 2014/0218708 A1 discloses multi-mirror arrays with individually tiltable mirror elements. A gap delimited by side faces of the adjacent mirror substrates is situated in each case between immediately adjacent mirror elements, in order to enable a collision-free relative movement of the adjacent mirror elements with respect to one another. Different measures are proposed in order to protect components of the multi-mirror array located behind the mirror surfaces from radiation-related damage (heating, radiation-induced degradation), and these measures are intended to prevent incident light from being able to reach the area behind the mirror surfaces through the gaps.

SUMMARY

The disclosure seeks to provide a multi-mirror array which remains functional for relatively long periods of time under the influence of short wavelength UV radiation when used in an apparatus operating with relatively short wavelength radiation from the ultraviolet range.

In an aspect, the disclosure provides a multi-mirror array comprising a carrier structure and a multiplicity of mirror units arranged next to one another on the carrier structure in a grid arrangement. Each of the mirror units comprises a base element and a mirror element mounted to be individually movable in relation to the base element. A mirror element comprises a mirror substrate which on a front face facing away from the base element carries a reflection coating for forming a mirror surface which reflects the used radiation well. Each mirror substrate also comprises a back face facing the base element and side faces on its circumference. The array of mirror elements is structurally designed so that a relative movement of the mirror elements with respect to one another is implemented without mutual collision in the entire specified movement range (range) of the mirror elements, with the result that mutual contacting of the mirror elements is precluded by design.

The mirror surfaces of the multi-mirror array are arranged next to one another in a manner substantially filling the area. They can consequently form a reflective overall area, which is significantly larger than the individual mirror surfaces. However, the overall area is not reflective throughout. Instead, a gap delimited by side faces of the adjacent mirror substrates is situated between immediately adjacent mirror elements. It is generally desirable to provide a collision-free relative movement of the adjacent mirror elements with respect to one another.

Functional components of the mirror unit are arranged in an intermediate space between the base element and the mirror element in the case of each mirror unit. For example, in the intermediate space between the base element and the mirror substrate, each mirror unit may comprise components of a suspension system for movably mounting the mirror element on the base element and components of an actuator system for creating movements of the mirror element relative to the base element in response to the reception of control signals. Additionally, sensor elements, for example position sensor elements, which sense the respective orientation of the mirror surfaces relative to the base element, may also be arranged in this intermediate space. Components of control electronics may be arranged on the top side of the base element facing the mirror element.

The suspension system can mechanically connect the mirror substrate to the base element. The suspension system can comprise e.g. resilient or flexible portions or components which provide the desired movability. The suspension system may contain articulations that connect components or portions of the former in an articulated manner, e.g. in the form of flexures. The actuator system can be a system that is constructed independently of the suspension system and provides forces and torques for the movement of the mirror elements. It is also possible for the suspension system and the actuator system to be integrated by virtue of portions of the suspension system also acting as functional parts of the actuator system. Components of the sensor system can likewise be integrated.

Thus, the entire actuator system, sensor system and further mechanical elements may be arranged below the mirror surface, i.e. between the latter and the carrier structure, in the case of this design. As a result, it can be achieved that the surface proportion of the reflective mirror surfaces of the individual mirrors in the overall area of the multi-mirror array can become very large.

To obtain a higher integration density, the manufacturing process increasingly makes use of techniques from the field of producing microelectromechanical systems (abbreviated: MEMS), for example in order to create drive elements (elements of the actuator system), mechanical elements (for example elements of the suspension system) and/or sensor elements or the like. Nowadays, such MEMS processes are based substantially on structuring processes in which an e.g. initial substrate made of silicon or a silicon compound is structured and in this way the components are designed.

The inventors have recognized that using MEMS techniques in the production of multi-mirror arrays can be offset by disadvantages. This applies for example to applications using EUV radiation. In these, consideration is given inter alia to the fact that an EUV-induced hydrogen plasma containing positively charged hydrogen ions (H*ions) and neutral H* radicals may arise due to ionization processes in a hydrogen-containing atmosphere under the action of high-energy EUV radiation. Hydrogen ions and radicals inter alia can have a strongly corrosive effect on silicon, with the result that there may be a corrosive ablation and, accordingly, structural changes and other degradation processes on the components of the mirror units under the action of hydrogen plasma.

On account of the gaps between the individual mirror substrates, functionally relevant components arranged in the intermediate space located therebehind between mirror surface or mirror substrate and carrier structure may also be attacked. For example, this can apply to MEMS structures. Numerous effects may contribute to this. Firstly, a hydrogen plasma containing hydrogen ions may be generated in the region in front of the mirror surfaces and may then pass through the gaps into the intermediate space, where it can attack the structures. It can be relevant if EUV radiation can pass through the gaps into the intermediate space between mirror substrate and carrier structure and can generate hydrogen ions there in the volume of the MEMS structures. For example, this may be the case if regions on the MMA whose lateral extent is greater than the typical lateral extent of the individual mirror surfaces are illuminated with EUV radiation.

The corrosive ablation of the components of the mirror units located behind the mirror surface, such as the corrosion of silicon, may cause two issues, for example. Firstly, silicon may be deposited on optical surfaces, to be precise not only on surfaces of the multi-mirror array but possibly also on other optical surfaces as a result of spread. This may cause significant transmission losses over relatively short periods of time, with the result that the actually available use durations of EUV apparatuses remain significantly behind the theoretically expected use times. Moreover, internal and external photoelectric effects may be triggered and may change the properties, such as the electrical properties, of functional structure elements of a mirror unit, with the result that no longer tolerable changes in the properties and possibly even complete failure may arise within a relatively short period of time (e.g. even within one year).

In addition to these defects caused by uncontrolled corrosive attacks, there are the already known impairments of performance, for example as a result of ingress of contamination particles made of tin or tin compounds into the region between the mirror substrates and the carrier structure. These may block or impede the movements of structural elements that are movable relative to one another and may also influence the positioning of mirrors during controlled tilting by virtue of disturbing the interplay between actuators and sensors. Further, issues may arise due to radiation-induced heating and degradation processes, and due to electrical disturbances on account of plasma flows and the photoelectric effect, especially in the region of surfaces directly exposed to incident EUV radiation.

Even if corrosion is not in the foreground of DUV applications, the functionalities and the service life may nevertheless also be significantly restricted in DUV apparatuses due to radiation-induced heating effects and malfunctions on account of induced photoelectric effects.

The inventors have developed solutions which may contribute to significantly reducing or largely preventing such issues.

According to certain embodiments, significant improvements, inter alia in view of the mentioned corrosion, can be achieved by virtue of at least portions of each of the side faces of the mirror substrates, or the entirety thereof, being oriented obliquely with respect to the assigned mirror surface or with respect to the front face of the mirror substrate at an angle that deviates from 90°. This represents a departure from certain previously known design principles, according to which the mirror elements are in each case designed such that the side faces are substantially perpendicular to the front face or to the mirror surface provided with the reflection coating. In this case, the wording "substantially perpendicular" means, in particular, that, within the respective manufacturing tolerances, the side faces of conventional mirror substrates were oriented perpendicular to the reflective front side at the edge regions of the mirror surfaces. Expressed differently, to the knowledge of the inventors, generic multi-mirror arrays have had no targeted measures to date that deviate from this conventional design.

Deviating therefrom, the suggestion here is to deliberately manufacture the full side faces, or at least a functionally important portion of each of the side faces, in such a way that this results in an oblique position in relation to the mirror surface, which is significantly outside of the manufacturing tolerances of the respective production process. Thus, it can be said that according to this aspect of the disclosure edge regions of mirror substrates are designed as protective structures by virtue of mirror substrate side faces of immediately adjacent mirror substrates being oriented obliquely with respect to the associated mirror surface at an angle that deviates from 900 in each case in full or at least in part or on average.

In this context, different configurations of an oblique side face are possible. The full height (situated between front face and back face) of a side face, as macroscopically plane surface, can be oriented obliquely with respect to the mirror surface at the same angle. If the back face extends parallel to the front face and if the opposite side face on the same mirror element is symmetrically oblique with respect thereto, the mirror substrate obtains a substantially trapezoidal cross-sectional form in a section guided between the opposite side faces.

A side face may also be convexly or concavely curved in full or in at least one portion. Such curved surface portions may be desirable on account of the producibility and/or in view of the function. A side face may comprise at least one portion oriented substantially perpendicular to the mirror surface. However, such perpendicular portions can be small in terms of area, i.e. oblique portions should dominate.

However, it is also possible for the side face to have a stepped form on a smaller scale, from which a macroscopic oblique orientation of the side face arises.

There are different options for realizing this concept of obliquely oriented side faces.

According to one development, the side faces of mirror substrates of immediately adjacent mirror substrates are designed and oriented such that the gap formed between immediately adjacent mirror substrates has a gap width (for non-tilted mirror elements in any case) which, from the front face of a mirror element provided with the reflection coating, increases in the direction of the base element continuously or on average at least in one or more portions. In the case of a neutral position of the mirror elements, the gap is tighter on the side of the mirror surface, i.e. on the side of the radiation entry, than on the side facing the base element (radiation exit side) as a result.

The design can be chosen such that the front face of a mirror element provided with the reflection coating has a greater surface area than the area enclosed by the outer edge of the back face, with an outer edge of the back face being inwardly recessed by a lateral offset in relation to an outer edge of the front face at all circumferential positions. This geometry can also be described as the mirror substrate tapering from the reflective front side in the direction of the back side or in the direction of the base element. The back face can extend substantially parallel to the front face.

To be able to understand features this approach, a few insights of the inventors are briefly explained hereinafter. The inventors have recognized that the side faces may contribute significantly to the input coupling of incident radiation into the intermediate space of adjacent mirror elements, especially if adjacent mirror elements are tilted with respect to one another. Contributing to this unwanted role is the fact that, during the production process for the multi-mirror array, the side faces adjoining the front surface, in addition to the latter, generally also receive a reflective coating. Although not required for the intended use of the multi-mirror array, this situation generally arises automatically if no countermeasures are taken. While the side faces generally receive no direct radiation, or only relatively little direct radiation, when the associated mirror element is in its non-tilted neutral position (tilt angle=0°) and the radiation enters with angles of incidence that are not too large in relation to a normal of a base plane, it may be the case that a relatively large portion of the incident radiation is incident directly on side faces at more or less large angles of incidence (grazing incidence) when the mirror element is tilted. A not insignificant portion of the radiation may then possibly be reflected in low-loss fashion or with great reflectivity on a side face and be input coupled into the intermediate space of an adjacent mirror unit with a significantly modified beam direction. It may thus be the case that single or multiple reflections of incident radiation on side faces of tilted mirror elements allow damaging radiation to reach regions behind adjacent mirror elements, the regions being "in the dark" in the case of non-tilted mirror elements, i.e. being shadowed by the mirror elements. Hence, it may be the case that only a relatively small region protected against direct irradiation remains behind a mirror element level with the base element and is able to be used to attach particularly radiation-sensitive components.

By contrast, if the side faces are placed obliquely such that behind the mirror surface they may "fall inwardly" in portions or over their entire height, then this damaging effect can be attenuated such that the radiation-protected regions behind the mirror elements are increased in size. This may result in more radiation-protected installation space behind each mirror element, and possible degradation processes and electrical disturbances (plasma flows, photoelectric effect) on account of damaging radiation can be slowed down or suppressed in full.

The extent of the oblique position can be adapted to the respective installation situation during use. The local angle of incidence range of the EUV radiation, for example, can be taken into account. As a rule, the oblique position need not be particularly pronounced. In some embodiments, the offset can be of the order of magnitude of 10% or less of the thickness or height of the mirror substrate (measured between the front face and the back face). For example, provision can be made for the offset to be at least 3%, such as at least 5% of the thickness/height and/or at most 15% of the thickness/height.

In an alternative or in addition, it may be desirable for the included angle at the transition between the front face and the adjacent side face to be in the range from 80° to 89°, such as in the range from 840 to 88°.

If the angle is significantly larger than the upper limit, it may hardly be possible to obtain an improvement in relation to the conventional perpendicular side faces. By contrast, if the angle is significantly below the lower limit, then it may be the case that, especially in the neutral position of the mirror elements, more intensity reaches the region to be protected in the case of radiation that is incident obliquely at relatively large angles of incidence and/or the protected (dark) regions become smaller than in the case of conventional solutions with perpendicular side faces.

A further approach includes controlling the production such that the side faces have a surface roughness which is at least one order of magnitude greater (i.e. at least by a factor of 10) than the surface roughness of the front face provided with the reflection coating. For example, the surface roughness of the side faces can be at least 100 nm RMS or at least 1000 nm RMS. By comparison: the surface roughness of polished optical surfaces is in the range of less than 1 nm RMS, or even less than 0.2 nm RMS, in the case of the applications considered here. The values relate to what is known as the root mean square (RMS) roughness. If the side faces are manufactured with a significant surface roughness by way of suitable measures, then it is possible to largely suppress specular reflections at the side faces, and incident radiation can merely be scattered over a large solid angle range. As a result, radiation incident on a rough side face is rendered "harmless" by virtue of its energy being distributed in space and/or absorbed in the region of the side face.

This measure (design of the side faces with a significant surface roughness) may be desirable independently of the other features of the side faces, especially also in the case of side faces substantially perpendicular to the mirror surface.

The solution of the oblique side faces can also be implemented differently.

According to one development, provision is made for edge regions of mirror substrates to be designed as corrosion protection structures by virtue of mirror substrate side faces of immediately adjacent mirror elements each being oriented obliquely to the assigned mirror surface at an angle deviating from 900 in such a way that the oblique side faces of adjacent mirror elements form a gap which is oriented obliquely with respect to the mirror surfaces and/or obliquely with respect to the incident EUV radiation and/or obliquely with respect to a base plane of the multi-mirror array. The gap can be designed such that direct radiation passage through the gap is blocked for a perpendicular radiation incidence (normal incidence) (in relation to the base plane), at least whenever the mirror elements are in their zero position. As a result, the intermediate space can be shielded against penetrating EUV radiation with the aid of the mirror substrates, even in the gap region. The shielding can be complete or in full. However, it may also be the case that only partial shielding is achieved.

The edge regions of the mirror substrates may be designed such that the gap has a first (front) gap opening with a first gap width adjacent to the mirror surfaces and a second (back) gap opening with a second gap width adjacent to back sides of the mirror substrates, with the first gap opening and the second gap opening having a lateral offset on account of the oblique orientation of the gap, with the result that an effective gap width of the oblique gap effective for a (direct) radiation passage is smaller than the first gap width and/or the second gap width. In particular, a vanishing effective gap width is achieved, i.e. a radiopaque gap. It may also be the case that, for a given absolute gap width, the effective gap width for the radiation transmission is less than the absolute gap width, but greater than zero. For example, in the case of mirror substrates with edge lengths in the range of one or a few millimeters and thicknesses in the range of one or a few tenths of a millimeter, the gap width can be in the range from 10 μm to 100 μm, such as in the range from 20 μm to 60 μm.

The lateral offset between the first gap opening and the second gap opening can be at least as large as the maximum of the first gap width and the second gap width. The beam direction at the installation location should be considered in the design phase such that the effective lateral offset, i.e. the lateral offset perpendicular to the beam direction, should be decisive. What this can achieve is that no EUV radiation can directly reach through the gaps into the intermediate space therebehind, in any case for perpendicular or virtually perpendicular incidence or for an oblique radiation incidence of the EUV radiation incident on the mirror surfaces.

The mirror substrate side can face are oriented such that a substantially plane-parallel gap arises when the mirror elements are in their respective neutral position. In this sense, a gap is "substantially plane-parallel" if the side faces delimiting the gap extend parallel to one another within the scope of the manufacturing tolerances or include an angle of less than at most 10°. Among other things, this facilitates the adjustment.

The mirror substrate side faces of adjacent mirror elements can be oriented such that an (acute) angle of less than 900 arises between the mirror substrate side face and the mirror surface on one side of a gap formed between the mirror elements and an (obtuse) angle of more than 90° arises on the opposite side, with the absolute values of the deviations from 90° on both sides being the same or virtually the same (deviations of up to 5°).

It was found in many cases to be beneficial if the oblique orientation of the mirror substrate side faces can be chosen such that the deviation from a 900 orientation with respect to the mirror surface is 10° or more, with the deviation being able to be in the range from 20° to 30° for example. As a result, a good compromise between gap width (this should generally be as small as possible) and pivot regions available without collision can be realized in the case of relatively small absolute gap widths.

In some arrangements, each mirror substrate respectively has oblique mirror substrate side faces on opposing sides, the mirror substrate side faces including an angle of more than 900 or of less than 900 with the mirror surface on one of the sides and including the same absolute angle, albeit in the opposite direction, on the opposing side. As a result, the mirror substrate obtains a substantially trapezoidal cross-sectional form in a section guided between the opposing side faces. Then, successive mirror elements in a row can have reversed trapezoidal cross-sectional form in alternation, with the result that the orientation of the interposed oblique gaps changes from gap to gap in alternation. This can apply to all directions in which mirror substrates are successively in a row, with the result that e.g. in the case of individual mirrors with a square mirror surface, the mirror substrates may have the form of a square pyramidal frustum.

Thus, it may be the case that edge regions of mirror substrates are designed as corrosion protection structures by virtue of mirror substrate side faces of immediately adjacent mirror substrates being oriented obliquely with respect to the associated mirror surface at an angle that deviates from 900 in each case.

As a result of the oblique position of the side faces, the edge regions of the mirror substrates may provide contributions, which act in different ways, to the protection of the components therebehind and may consequently also act as constituent part of a corrosion protection system and/or of a system for protection against electrical disturbances.

According to some embodiments, the multi-mirror array is equipped with a corrosion protection system which inter alia is configured to prevent or, in comparison with mirror units without corrosion protection system, reduce a material-ablating and/or structure-modifying corrosive attack of EUV radiation-induced hydrogen plasma on components of the mirror units arranged between the mirror surfaces and the carrier structure. In this case, the corrosion protection system comprises corrosion protection structures. As described, corrosion protection structures may be formed or arranged on the mirror elements. Corrosion protection structures may also be formed or arranged on the base elements and/or on components of the suspension system and/or on components of the actuator system and/or on components of an optionally present sensor system.

A "corrosion protection structure" within the meaning of this application is a structural component of the multi-mirror array which is in particular designed and effective for counteracting the described corrosion. In comparison with a known multi-mirror array, a corrosion protection structure can be provided by virtue of the latter being attached to the conventional structure as an additional structural feature. It is also possible to create a corrosion protection structure by virtue of a component present in a conventional multi-mirror array receiving a particular design or shape that offers improved protection against corrosive attacks.

As a result of the effect of the aforementioned corrosive attacks being able to be reduced or even prevented entirely with the aid of the corrosion protection system or the corrosion protection structures, the degradation appearances caused by corrosion can be largely avoided or in each case slowed down in terms of their temporal development such that a productive operation is possible over significantly longer use durations than in the absence of corrosion protection systems. As a result of the corrosion protection system comprising corrosion protection structures at one or more components of a mirror unit, the corrosion protection structures being formed on or attached to the respective component, these can be created and/or attached accordingly immediately during the production of the multi-mirror array and need not be produced as separate units and optionally need not be installed separately and adjusted in relation to the multi-mirror array.

Corrosive attack can be reduced or avoided in different ways with the aid of the corrosion protection structures. For example, a corrosion protection structure can be designed such that e.g. EUV radiation is prevented from being radiated into the intermediate space between the mirror surface and carrier structure or the amount of incoming radiation is reduced in relation to a design without corrosion protection structure. This can avoid the generation of corrosive plasma in the intermediate space, and the rate of corrosion in this region can be reduced as a result. In an alternative or in addition, it is also possible to design corrosion protection structures such that plasma generated in front of the mirror surfaces is prevented from penetrating into the intermediate space through the gaps in significant amounts and contributing there to the corrosive attack.

At least the base element, the suspension system, and the actuator system can be formed as a MEMS structure made of silicon (Si) or a silicon compound. Then, conventional MEMS techniques for the production of small structures can be adapted well. However, provision can also be made for at least some of the structures, in particular the mirror substrate, to be designed from a material that cannot be attacked, or can be attacked to a lesser extent than silicon, by a corrosive attack, for example aluminum oxide ($Al_2O_3$).

According to one development, provision can be made for immediately adjacent mirror elements, or the mirror surfaces thereof, to be arranged offset in height relative to one another on a permanent or temporary basis such that a first reference point defined by one of the mirror surfaces and a second reference point defined by the immediately adjacent mirror surface are located over one another spaced apart in height, with the reference point corresponding to the geometric center of a mirror surface. The height offset, which is then also present in the region of the gap formed between the mirror elements with the same or similar size, allows the realization of relatively large tilt ranges available without collision since the height offset provides the disturbance contours formed by the respectively opposite edges of the mirror elements with a greater distance from one another. The height offset may be present in a manner defined in advance and hence fixed. For example, it may be in the range from 25% to 75% of the substrate thickness. A particularly effective overlap with adjacent mirror substrates is realizable as a result.

The multi-mirror array may comprise a controllable height adjustment device for the reversible, continuous height adjustment of individual mirror elements in relation to adjacent mirror elements in response to control signals.

Some embodiments provide for the actuator system for creating a movement of a mirror element to be designed not only for two rotational degrees of freedom but also for one translational degree of freedom, wherein the translational degree of freedom can be used for a controllable height adjustment. The translational degree of freedom may correspond to a movement of the mirror element along a translation axis, which is perpendicular or at an angle to axes of rotation of the rotational degrees of freedom. The axes of rotation of the rotational degrees of freedom can be located in a plane in a manner substantially orthogonal to one another, and the translation axis of the translational degree of freedom runs perpendicular to the plane.

In an alternative or in addition, the base elements can be height-adjustable on an individual basis, with the result that the entire mirror units can be lifted and lowered again, e.g. with the aid of at least one thickness-changeable piezoelectric layer between the carrier structure and base element.

As described, the height offset may be desirable for collision reasons inter alia, and therefore desirable. In the overall optical system containing the EUV multi-mirror array, i.e. for example in an illumination system for an EUV apparatus, a corresponding allowance may be provided in order to take account of the fact that adjacent mirror elements of an EUV multi-mirror array are offset relative to one another in terms of their height, with the result that they reflect at planes or surfaces which are offset from one another in the incoming radiation direction.

Some embodiments provide for a controller of the height adjustment device to be configured such that a height adjustment of a mirror element is creatable depending on the tilt position of adjacent mirror elements. What this can achieve, inter alia, is that switching position-dependent collisions are avoided and the illumination is optimized according to the switching state.

The controllable relative height adjustment of adjacent mirror elements of an EUV multi-mirror array can also be desirable independently of the other features of the EUV multi-mirror arrays described herein and may be an disclosure worthy of protection in its own right, for example in EUV multi-mirror arrays whose mirror elements comprise side faces oriented perpendicular to the mirror surface and hence lack oblique gaps.

As an alternative or in addition to the measures described until this point, some embodiments provide for the corrosion protection system to comprise corrosion protection structures in the form of radiation trap elements which comprise a radiation incidence surface in each case arranged on the back side of the mirror substrates facing away from the mirror surfaces in the region of a gap. Such a radiation incidence surface may be arranged in the immediate vicinity of the carrier-side second gap opening of a gap and may project beyond the latter on both sides such that even EUV rays passing through the gap at an angle are still incident on the radiation incidence surface and can thus be mitigated in terms of their negative effect. The radiation trap elements may optionally be created as MEMS structures, optionally integrally with other structures during the production of the mirror units.

Optionally, the radiation trap elements may use different functional mechanisms on an individual basis or in combination with one another. According to an embodiment, at least the region of the radiation incidence surface of a radiation trap element includes a functional material which is an absorber material with an absorbent effect for EUV radiation and/or which is a recombination catalyst which, upon contact with hydrogen ions and hydrogen atoms, increases the recombination probability with regard to the formation of $H_2$ molecules. According to current knowledge, suitable functional materials can include materials from the following group: ruthenium (Ru), platinum (Pt), rhenium (Rh), rhodium (Rh), iridium (Ir), molybdenum (Mo), nickel (Ni) and iron (Fe). These have both absorbent and recombination-promoting properties.

Provision can be made for the radiation trap elements to be height-adjustable in sections. A height setting of the respective radiation trap element may optionally be created depending on the tilt positions and/or height positions of adjacent mirror elements, in order to provide a better individual corrosion protection.

According to one development, a further approach for reducing corrosion includes the corrosion protection system comprising at least one protection membrane which comprises a gap covering portion which bridges a gap formed between immediately adjacent mirror substrates and which is in contact with the mirror substrates delimiting the gap, in particular fastened to the mirror substrates. Thus, the protection membrane and/or the gap covering portion are carried directly by the adjacent mirror elements and can therefore be installed and removed therewith. Thus, these are not separate elements; instead, a gap covering portion can be produced together with the adjacent mirror elements which carry the gap covering portion. Optionally, the protection membrane or a gap covering portion may also be fastened to the mirror elements at a later date. A gap covering portion may be arranged on the front side of the mirror elements and hence cover the first gap opening. This already can create protection for the region of the gap. However, it is also possible that a gap covering portion is attached in the region of the second gap opening, i.e. acts only after the passage of the gap.

There are various options regarding the design of the gap covering portion. In some embodiments, the entire gap covering portion includes an EUV-transparent material. This can allow EUV radiation to reach into the intermediate space through the gap covering portion. However, hydrogen plasma can be prevented from reaching the intermediate space from the region in front of the mirror arrangement, and so this can provide a corrosive attack reduction in this respect. This arrangement can also prevent a blockage of two adjacent channels on account of particle contamination.

In some embodiments, the protection membrane in the region of the mirror covering portion comprises an absorber material with an absorbent effect for EUV radiation, the absorber material for example possibly being selected from the group: Ru, Pt, Re, Rh, Ir, Mo, Ni, Fe. In these variants, the gap covering portion not only provides protection against hydrogen plasma penetrating into the intermediate space but also blocks EUV radiation, with the result that, in this respect, no new hydrogen plasma can be generated in the intermediate space either.

In embodiments in which a protection membrane is attached on the entrance side of the gaps, i.e. level with the mirror front side, the protection membrane can be affixed to the outer side of the mirror surface in the edge region thereof. If this relates to an EUV-transparent protection membrane, it can also be applied to a plurality of adjacent mirror surfaces as a large-area membrane which extends over them, and it can also bridge the interposed gaps in the process. The membrane can be designed to be so flexible that the mirrors can also be tilted relative to one another without placing an excessive mechanical load on the gap covering portion covering the interposed gap.

One development provides for the protection membrane on the front side of the mirror substrates to be arranged as part of a multilayer layer arrangement between the mirror substrates and the reflection coating. What this can achieve is that the free surface of the reflection coating is not occupied by the protection membrane, whereby particularly high levels of reflectivity are possible since the multilayer layer arrangement is not covered by a membrane.

It is also possible for a protection membrane to be arranged on the back side of the mirror substrates. In variants with radiation trap elements, a protection membrane can be arranged e.g. between the back side of the mirror substrate and a front side or a back side of a radiation trap element. In cases with radiation trap elements mounted in height-adjustable fashion, the radiation trap element may be taken along in the height adjustment direction as a result of the layer stress of the protection membrane between the mirror unit and the radiation trap element, with the result that a tilt position-dependent height adjustment of the radiation trap element can be achieved. A separate actuator for adjusting the height of the radiation trap element can be dispensed with as a result.

In an alternative or in addition to one or more of the aforementioned measures, provision can be made for the corrosion protection system to comprise at least one corrosion protection structure in the form of a corrosion protection layer, which in a region vulnerable to a corrosive attack is applied to a component of the mirror unit including a component material, with the corrosion protection layer comprising at least one protection layer material which has a greater corrosion resistance than the component material to a corrosive attack with hydrogen ions. In the case of components made of silicon or a silicon compound, a corrosion protection layer may consist of (or comprise), for example, aluminum in a non-oxidized state or in an oxidized state, i.e. of $Al_2O_3$.

The application of the disclosure and its exemplary embodiments is not limited to mirror units whose components are produced on the basis of silicon or a silicon compound using MEMS manufacturing technology. Thus, it is possible to manufacture some or all components vulnerable to a corrosive attack from a material that is particularly resistant to a corrosive attack, for example from aluminum oxide, at least in those surface regions of the components potentially exposed to a corrosive attack.

The disclosure also relates to an illumination system for an EUV apparatus, wherein the illumination system is embodied to receive, during operation of the EUV apparatus, EUV radiation from an EUV radiation source and to shape, from at least one portion of the received EUV radiation, illumination radiation that is directed into an illumination field in an exit plane of the illumination system. The illumination system has at least one EUV multi-mirror array of the type described in this application.

The EUV apparatus can be, for example, a projection exposure apparatus for EUV microlithography or a mask inspection apparatus, employing EUV radiation, for inspecting masks (reticles) for EUV microlithography.

BRIEF DESCRIPTION OF THE DRAWINGS

Further features and aspects of the disclosure are evident from the claims and from the description of exemplary embodiments of the disclosure, which will be explained below with reference to the figures.

FIGS. 9A to 9C schematically illustrate a first variant of a production method for a multi-mirror array with oblique gaps;

FIG. 13 shows a diagram for explaining simulation calculations which describe the relationship between tilt positions of the mirror elements and the irradiation of the base elements;

DETAILED DESCRIPTION

Figure 1:
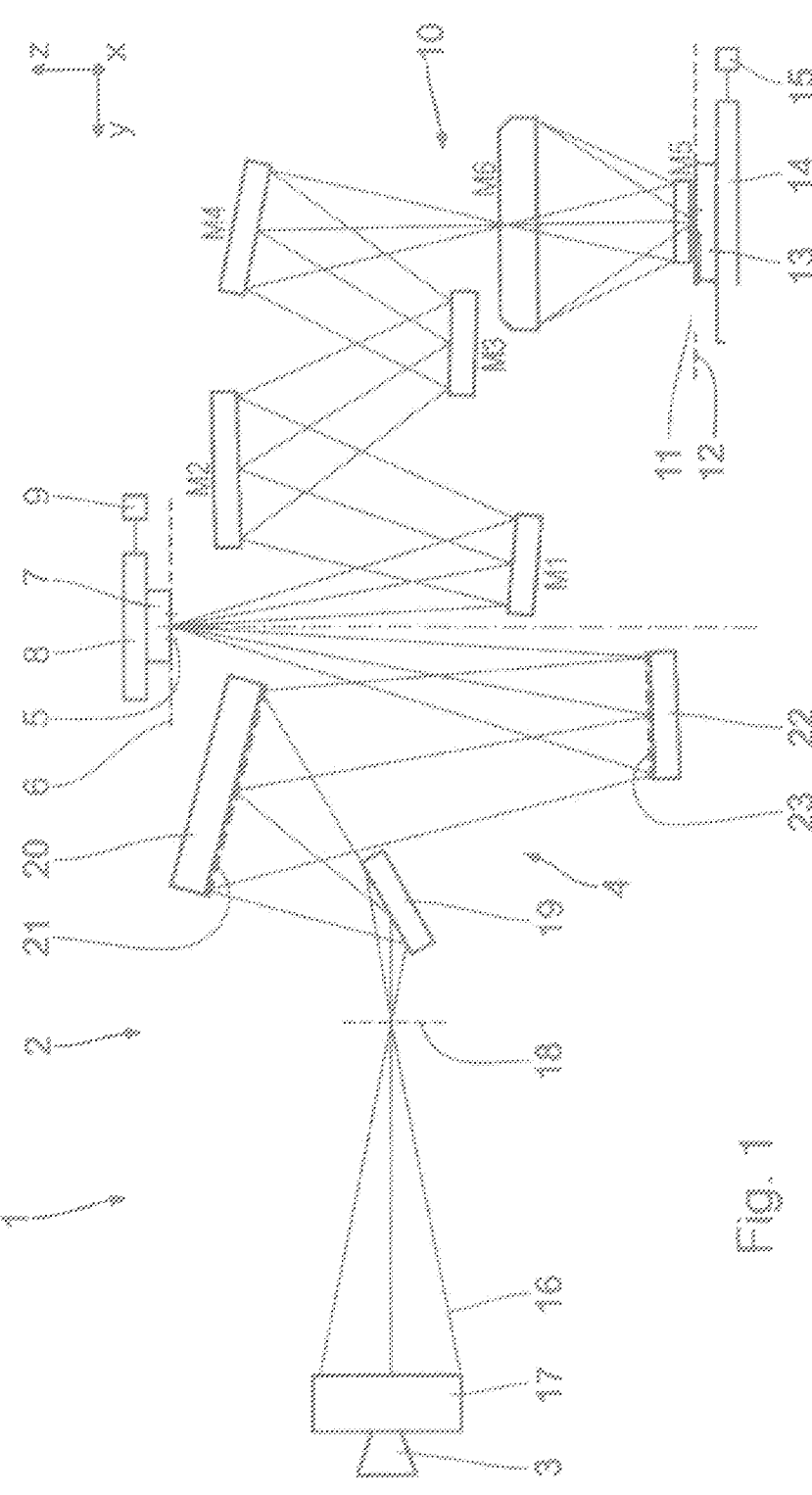
FIG. 1 schematically shows optical components of an EUV microlithography projection exposure apparatus having an illumination system containing one or more EUV multi-mirror arrays according to one exemplary embodiment.

Examples of multi-mirror array designs will be explained by way of example below with reference to possible uses in EUV apparatuses from the field of microlithography. A multi-mirror array having reflection layers with a reflective effect for EUV radiation is referred to here as an EUV multi-mirror array.

Certain components of a microlithographic projection exposure apparatus 1 are first described by way of example hereinafter with reference to FIG. 1. The description of the basic setup of the projection exposure apparatus 1 and its components should not be regarded as limiting here.

An illumination system 2 of the projection exposure apparatus 1, as well as a radiation source 3, has an illumination optical unit 4 for illumination of an object field 5 in an object plane 6. What is exposed here is a reticle 7 arranged in the object field 5. The reticle 7 is held by a reticle holder 8. The reticle holder 8 is displaceable, in particular in a scanning direction, by way of a reticle displacement drive 9.

FIG. 1 shows a Cartesian xyz-coordinate system for explanatory purposes. The x-direction runs perpendicular to the plane of the drawing. The y-direction runs horizontally, and the z-direction runs vertically. The scanning direction runs in the y-direction in FIG. 1. The z-direction runs perpendicular to the object plane 6.

The projection exposure apparatus 1 comprises a projection optical unit 10. The projection optical unit 10 serves for imaging the object field 5 into an image field 11 in an image plane 12. The image plane 12 extends parallel to the object plane 6. Alternatively, an angle that differs from 0° between the object plane 6 and the image plane 12 is also possible.

A structure on the reticle 7 is imaged onto a light-sensitive layer of a wafer 13 arranged in the region of the image field 11 in the image plane 12. The wafer 13 is held by a wafer holder 14. The wafer holder 14 is displaceable, in particular along the y-direction, by way of a wafer displacement drive 15. The displacement of the reticle 7 on the one hand by way of the reticle displacement drive 9 and of the wafer 13 on the other hand by way of the wafer displacement drive 15 may be synchronized with one another.

The radiation source 3 is an EUV radiation source. The radiation source 3 emits EUV radiation 16 in particular, which is also referred to below as used radiation or illumination radiation. In particular, the used radiation has a wavelength in the range between 5 nm and 30 nm. The radiation source 3 may be a plasma source, for example an LPP (laser produced plasma) source or a GDPP (gas discharge produced plasma) source. It can also be a synchrotron-based radiation source. The radiation source 3 may be a free electron laser (FEL).

The illumination radiation 16 emanating from the radiation source 3 is focused by a collector 17. The collector 17 may be a collector with one or more ellipsoidal and/or hyperboloid reflection surfaces. The illumination radiation 16 may be incident on the at least one reflection surface of the collector 11 with grazing incidence (GI), which is to say at angles of incidence of greater than 45°, or with normal incidence (NI), which is to say at angles of incidence of less than 45°. The collector 11 may be structured and/or coated, both to optimize its reflectivity for the used radiation and to suppress extraneous light.

Downstream of the collector 17, the illumination radiation 16 propagates through an intermediate focus in an intermediate focal plane 18. The intermediate focal plane 18 may represent a separation between a radiation source module, having the radiation source 3 and the collector 17, and the illumination optical unit 4.

The illumination optical unit 4 comprises a deflection mirror 19 and, downstream thereof in the beam path, a first facet mirror 20. The deflection mirror 19 may be a plane deflection mirror or, alternatively, a mirror with a beam-influencing effect that goes beyond the purely deflecting effect. In an alternative or in addition thereto, the mirror 19 can be embodied as a spectral filter separating a used light wavelength of the illumination radiation 16 from extraneous light having a wavelength that deviates therefrom. If the first facet mirror 20 is arranged in a plane of the illumination optical unit 4 which is optically conjugate to the object plane 6 as field plane, then this facet mirror is also referred to as a field facet mirror. The first facet mirror 20 comprises a plurality of individual first facets 21, which are also referred to below as field facets. FIG. 1 depicts only some of the facets 21 by way of example.

The first facets 21 can be in the form of macroscopic facets, in particular in the form of rectangular facets or in the form of facets with an arcuate edge contour or an edge contour formed as partly circular. The first facets 21 may be in the form of plane facets or alternatively in the form of convexly or concavely curved facets.

As is known for example from DE 10 2008 009 600 A1, the first facets 21 themselves may also each be composed of a multiplicity of individual mirrors, in particular a multiplicity of micromirrors. The first facet mirror 20 may in particular be in the form of a microelectromechanical system (MEMS system). For details, reference is made to DE 10 2008 009 600 A1.

The illumination radiation 16 travels horizontally, that is to say along the y-direction, between the collector 17 and the deflection mirror 19.

In the beam path of the illumination optical unit 4, a second facet mirror 22 is arranged downstream of the first facet mirror 20. Provided the second facet mirror 22 is arranged in a pupil plane of the illumination optical unit 4, it is also referred to as a pupil facet mirror. The second facet mirror 22 can also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1 and U.S. Pat. No. 6,573,978.

The second facet mirror 22 comprises a plurality of second facets 23. In the case of a pupil facet mirror, the second facets 23 are also referred to as pupil facets.

The second facets 23 may likewise be macroscopic facets, which may for example have a round, rectangular or else hexagonal periphery, or may alternatively be facets composed of micromirrors. In this regard, reference is likewise made to DE 10 2008 009 600 A1.

The second facets 23 can have plane or, alternatively, convexly or concavely curved reflection surfaces.

The illumination optical unit 4 thus forms a double-faceted system. This fundamental principle is also referred to as a fly's eye integrator.

It may be desirable to arrange the second facet mirror 22 not exactly in a plane that is optically conjugate to a pupil plane of the projection optical unit 7.

With the aid of the second facet mirror 22, the individual first facets 21 are imaged into the object field 5. The second facet mirror 22 is the last beam-shaping mirror or indeed the last mirror for the illumination radiation 16 in the beam path upstream of the object field 5.

In a further embodiment (not illustrated) of the illumination optical unit 4, a transfer optical unit may be arranged in the beam path between the second facet mirror 22 and the object field 5, and contributes in particular to the imaging of the first facets 21 into the object field 5. The transfer optical unit may have exactly one mirror or, alternatively, two or more mirrors, which are arranged in succession in the beam path of the illumination optical unit 4. The transfer optical unit may in particular comprise one or two normal-incidence mirrors (NI mirrors) and/or one or two grazing-incidence mirrors (GI mirrors).

In the design shown in FIG. 1, the illumination optical unit 4 has exactly three mirrors downstream of the collector 17, specifically the deflection mirror 19, the field facet mirror 20, and the pupil facet mirror 22.

The deflection mirror 19 may also be omitted in a further embodiment of the illumination optical unit 4, and so the illumination optical unit 4 may then have exactly two mirrors downstream of the collector 17, specifically the first facet mirror 20 and the second facet mirror 22.

The imaging of the first facets 21 into the object plane 6 via the second facets 23 or using the second facets 23 and a transfer optical unit is, as a rule, only approximate imaging.

The projection optical unit 10 comprises a plurality of mirrors Mi, which are consecutively numbered in accordance with their arrangement in the beam path of the projection exposure apparatus 1.

In the example illustrated in FIG. 1, the projection optical unit 10 comprises six mirrors M1 to M6. Alternatives with four, eight, ten, twelve, or any other number of mirrors Mi are likewise possible. The penultimate mirror M5 and the last mirror M6 each have a through opening for the illumination radiation 16. The projection optical unit 10 is a doubly obscured optical unit. The projection optical unit 10 has an image-side numerical aperture which is greater than 0.5 and which can also be greater than 0.6 and, for example, can be 0.7 or 0.75.

Reflection surfaces of the mirrors Mi can be in the form of free-form surfaces without an axis of rotational symmetry. Alternatively, the reflection surfaces of the mirrors Mi can be designed as aspherical surfaces with exactly one axis of rotational symmetry of the reflection surface shape. Just like the mirrors of the illumination optical unit 4, the mirrors Mi may have highly reflective coatings for the illumination radiation 16. These coatings may be in the form of multilayer coatings, in particular with alternating layers of molybdenum and silicon.

The projection optical unit 10 has a large object-image offset in the y-direction between a y-coordinate of a center of the object field 5 and a y-coordinate of the center of the image field 11. In the y-direction, this object-image offset can be of approximately the same magnitude as a z-distance between the object plane 6 and the image plane 12.

The projection optical unit 10 may in particular have an anamorphic form. In particular, it has different imaging scales $\beta_x$, $\beta_y$ in x- and y-directions. The two imaging scales $\beta_x$, $\beta_y$ of the projection optical unit 7 can be at $(\beta_x, \beta_y) = (+/-0.25, +/-0.125)$. A positive imaging scale $\beta$ means imaging without image inversion. A negative sign for the imaging scale 3 means imaging with image inversion.

The projection optical unit 7 consequently leads to a reduction in size with a ratio of 4:1 in the x-direction, which is to say in a direction perpendicular to the scanning direction.

The projection optical unit 10 leads to a reduction in size of 8:1 in the y-direction, i.e. in the scanning direction.

Other imaging scales are likewise possible. Imaging scales with the same signs and the same absolute values in the x-direction and y-direction, for example with absolute values of 0.125 or 0.25, are also possible.

The number of intermediate image planes in the x-direction and in the y-direction in the beam path between the object field 5 and the image field 11 may be the same or may be different depending on the design of the projection optical unit 10. Examples of projection optical units with different numbers of such intermediate images in the x- and y-directions are known from US 2018/0074303 A1.

One of the pupil facets 23 in each case is assigned to exactly one of the field facets 21, in each case to form an illumination channel for illuminating the object field 5. In particular, this can produce illumination according to the Köhler principle. The far field is deconstructed into a multiplicity of object fields 5 using the field facets 21. The field facets 21 generate a plurality of images of the intermediate focus on the pupil facets 23 respectively assigned thereto.

The field facets 21 are imaged in each case by an assigned pupil facet 23 onto the reticle 7 superposed on one another in order to illuminate the object field 5. The illumination of the object field 5 is in particular as homogeneous as possible. It can have a uniformity error of less than 2%. Field uniformity can be achieved by superposing different illumination channels.

The illumination of the entrance pupil of the projection optical unit 10 can be geometrically defined by an arrangement of the pupil facets. The intensity distribution in the entrance pupil of the projection optical unit 10 can be set by selecting the illumination channels, in particular the subset of the pupil facets that guide light. This intensity distribution is also referred to as illumination setting.

A pupil uniformity in the region of portions of an illumination pupil of the illumination optical unit 4 that are illuminated in a defined way can be achieved by a redistribution of the illumination channels.

Further aspects and details of the illumination of the object field 5 and in particular of the entrance pupil of the projection optical unit 10 are described below.

The projection optical unit 10 may in particular have a homocentric entrance pupil. The latter may be accessible. It may also be inaccessible.

The entrance pupil of the projection optical unit 10 generally cannot be illuminated exactly via the pupil facet mirror 22. The aperture rays often do not intersect at a single point in the event of imaging the projection optical unit 10, which telecentrically images the center of the pupil facet mirror 22 onto the wafer 13. However, it is possible to find a surface area in which the spacing of the aperture rays, which is determined in pairs, becomes minimal. This surface area represents the entrance pupil or a surface area in real space that is conjugate thereto. In particular, this surface area exhibits a finite curvature.

It may be the case that the projection optical unit 10 has different positions of the entrance pupil for the tangential beam path and for the sagittal beam path. In this case, an imaging element, in particular an optical component of the transfer optical unit, should be provided between the second facet mirror 22 and the reticle 7. With the aid of this optical element, the different poses of the tangential entrance pupil and the sagittal entrance pupil can be taken into account.

In the arrangement of the components of the illumination optical unit 4 illustrated in FIG. 1, the pupil facet mirror 22 is arranged in an area conjugate to the entrance pupil of the projection optical unit 10. The field facet mirror 20 is arranged with a tilt in relation to the object plane 5. The first facet mirror 20 is arranged with a tilt in relation to an arrangement plane defined by the deflection mirror 19.

The first facet mirror 20 is arranged with a tilt in relation to an arrangement plane defined by the second facet mirror 22.

The mirror modules of the illumination system 1, which define the illumination beam path, are housed in an evacuable chamber in the interior of a housing, surrounded by a negative pressure atmosphere containing small amounts of hydrogen ($H_2$). The chamber communicates with a vacuum pump via a fluid line, in which a shut-off valve is accommodated. The operating pressure in the evacuable chamber is a few pascal. For example, the partial pressure of hydrogen ($H_2$) can be in the range from 2 Pa to 20 Pa. All other partial pressures are usually in the ppm range.

The first facet mirror (field facet mirror) 20 and the second facet mirror (pupil facet mirror) 22 are examples of controllable EUV multi-mirror arrays in the form of multi-mirror arrays (MMA).

Figure 2:
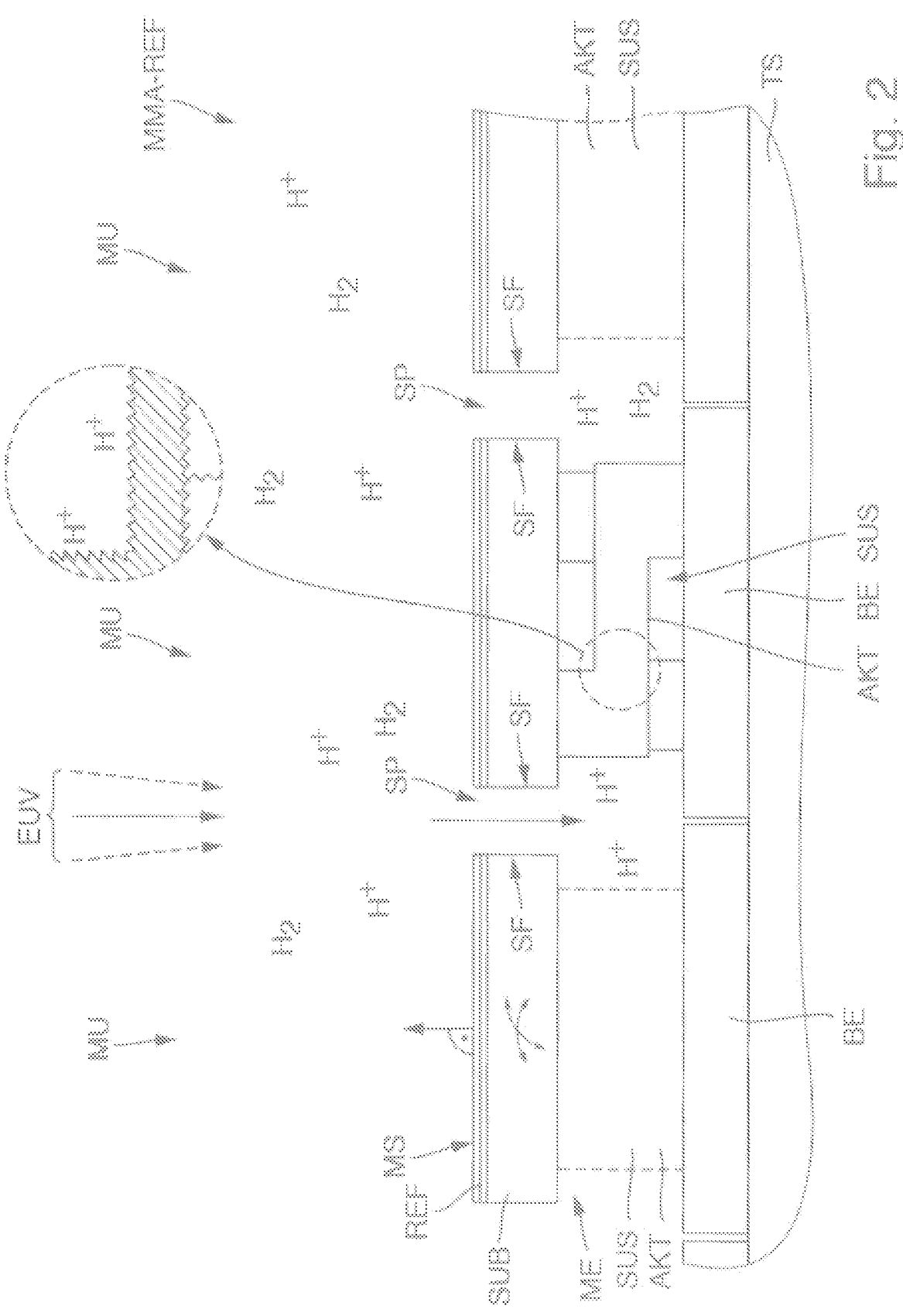
FIG. 2 shows a schematic section of a conventional EUV multi-mirror array in a plasma environment containing $H^+$ ions.

FIG. 2 is used to explain an exemplary setup of such an EUV multi-mirror array from the prior art (reference system with reference sign MMA-REF).

Arranged on a dimensionally stable carrier structure TS in the form of a base plate are a large number of mirror units MU which are arranged one next to the other in a matrix-type two-dimensional grid arrangement in rows and columns on the carrier structure TS.

Each of the mirror units MU has a base element BE fastened to the carrier structure and a mirror element ME, which is mounted via a flexible suspension system SUS so as to be individually movable relative to the base element BE. In the case of the example, the mirror elements ME can be tilted individually in two rotational degrees of freedom relative to the associated base element BE. Each mirror element ME has a substantially plate-type mirror substrate SUB, which on its front face facing away from the base element BE has a reflection coating REF, which forms a mirror surface MS that is reflective for EUV radiation. The reflection coating has a multi-layer structure (multilayer) with a plurality of pairs of layer material (for example Mo—Si), that are, in alternation, highly refractive and, relative thereto, low refractive, possibly with intermediate layers. The front face or the corresponding mirror surface MS can be planar or slightly concavely or convexly curved. Curved surfaces can be spherically or aspherically curved.

The mirror units MU are attached so close to one another that the mirror surfaces MS are arranged one next to the other in a substantially area-filling manner. This means, in particular, that the ratio of the sum of the mirror surfaces of the individual mirror elements ME to the total area of the mirror array that is occupied by mirror units, what is known as the integration density, is relatively high, for example greater than 0.7 or greater than 0.8 or greater than 0.9. Completely filling the area is not possible because in each case a gap SP delimited by way of side faces SF of the adjoining mirror substrates SUB remains between immediately adjacent mirror elements ME, through which a collision-free relative movement of the adjacent mirror elements relative to one another is ensured. The gap widths between side faces of immediately adjacent mirror substrates facing one another can be, for example, of an order of magnitude of a few tens of micrometers, for example in the range between 20 μm and 100 μm.

In each mirror unit MU, components of a resilient suspension system SUS which structurally connects the mirror element ME and the base element BE, creates a movable support for the mirror element relative to the base element with defined degrees of freedom, and provides restoring forces that lead to a mirror element automatically being brought to a zero position without tilt in the absence of actuator forces are arranged between the base element BE and the mirror element ME. Furthermore, components (not depicted in detail) of an actuator system for producing movements of the mirror element in relation to the base element in response to the reception of control signals from the control device are arranged in the intermediate space between the mirror substrate and the base element. These may be integrated into the structure of the suspension system, e.g. in the form of portions which change the length and/or bend in response to control signals. Furthermore, components (not depicted) of e.g. capacitive position sensors are present, with which the current relative position of the mirror element with respect to the base element can be sensed and corresponding signals can be output to the control unit. Closed-loop control of the individual tilt angles of the mirror substrates with respect to the carrier structure is thus ensured. The tiltable mirror elements can be tilted around the zero position for example in a displacement range (range) of 50 mrad, in particular ±100 mrad or more, and setting accuracies can be, for example, better than 0.2 mrad, in particular better than 0.1 mrad.

High integration densities can be achieved by virtue of, inter alia, the mirror arrays being produced using techniques from the field of producing microelectromechanical systems (MEMS). In the example of FIG. 2, at least the base element BE, the suspension system SUS, the actuator system, and the position sensor system are formed as MEMS structure. These days, MEMS structures are usually produced from silicon or silicon compounds. DE 10 2015 204 874 A1 (corresponding to US 2017/363861 A1) describes EUV multi-mirror arrays having MEMS structures made of silicon or a silicon compound, which may serve as an example of conventional EUV multi-mirror arrays and, in this respect, are incorporated in the content of the description by reference.

FIG. 2 schematically illustrates some issues which may lead to a premature degradation of the functionalities of EUV multi-mirror arrays, especially those containing MEMS structures. As mentioned, the multi-mirror systems are used in largely evacuated chambers, wherein small partial pressures of hydrogen ($H_2$) are present as a rule. The high-energy EUV radiation in the illumination beam path (EUV arrows) causes ionization of the $H_2$ molecules to a significant extent into positively charged hydrogen ions ($H_3^+$, $H^+$) and electrons. As a result, a hydrogen ion-containing plasma is created in the region through which radiation passes. High hydrogen ion concentrations may be generated in the irradiated region in front of the mirror surfaces, i.e. on the side of the multi-mirror array facing away from the carrier structure TS. However, EUV radiation may also pass through the gaps SP even into the intermediate space ZR between the mirror substrate SUB and the carrier structure TS and generate hydrogen ions there.

The hydrogen ion-containing plasma induced by EUV radiation has a corrosive effect on the mechanical components of the EUV multi-mirror array, especially if the latter include silicon or a silicon compound. As a result, the surfaces exposed to the plasma are attacked by material ablation, as illustrated by the detail in FIG. 2. The corrosive attack may also release silicon compounds which can be deposited again at another point in the structure. The structural changes as a result of material ablation by corrosion and consequential deposits may impair the MEMS functionality. Deposits formed on the mirror surfaces MS may moreover reduce the reflectivity and hence reduce the transmission of the illumination system.

In view of this, exemplary embodiments of EUV multi-mirror arrays according to the disclosure are equipped with corrosion protection structures of a corrosion protection system which is specifically designed and adapted to prevent or, at least in comparison with mirror units without corrosion protection system, reduce the described material-ablating and structure-modifying corrosive attack of EUV radiation-induced hydrogen plasma on components of the mirror units arranged between the mirror surfaces and the carrier structure. In this case, the corrosion protection system comprises corrosion protection structures which are situated on selected components of the EUV multi-mirror array or formed on these components. A few constructional measures in the form of corrosion protection structures for reducing or avoiding issues caused by a corrosive attack are explained in exemplary fashion hereinbelow.

Figure 3:
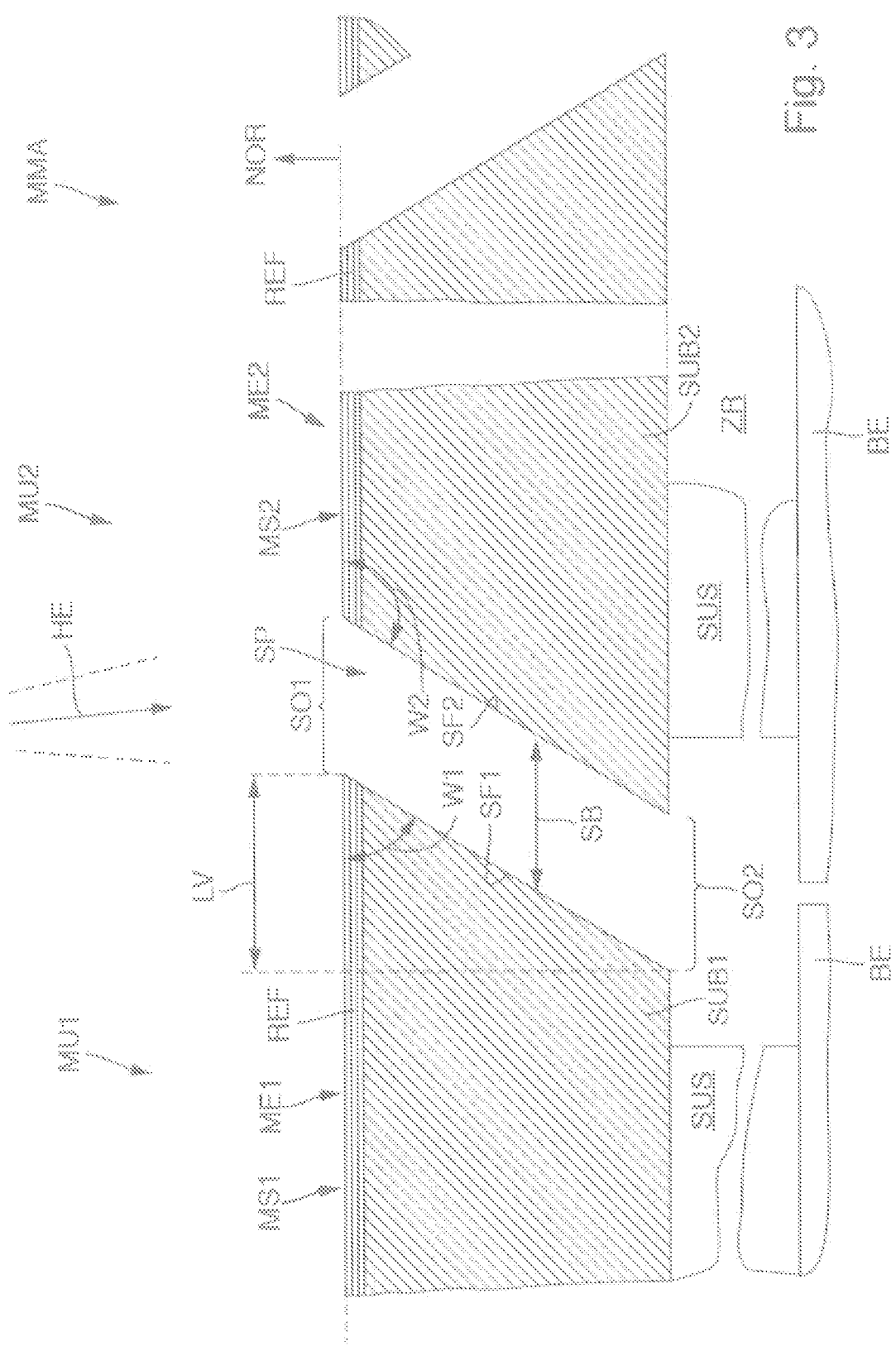
FIG. 3 shows a perpendicular section through a transition region between two immediately adjacent mirror units, with an EUV radiation-blocking oblique gap being located between the mirror substrates.

Schematic FIG. 3, which is not true to scale, shows a perpendicular section through a transition region between two immediately adjacent mirror units MU1, MU2 of an MMA in the region of the mirror substrates (first mirror substrate SUB1, second mirror substrate SUB2) of two adjacent mirror elements ME1, ME2. Between the mirror substrates is a gap SP, which is delimited on sides of the first mirror substrate SUB1 by the latter's first side face SF1 and on sides of the second mirror substrate SUB2 by the latter's closest second side face SF2. The two mirror elements are in their neutral position, i.e. they are not tilted in relation to one another. The mirror surfaces MS1, MS2 facing the incident EUV radiation EUV define an overall mirror surface together with the mirror surfaces of the other mirror elements, the global surface normal NOR of the overall mirror surface running obliquely with respect to the principal direction of incidence of the incident EUV radiation. In the real case, the incident EUV radiation originates from an angle of incident range for example extending by ±5° or ±100 about this principal direction of incidence.

In respect of the basic design, the multi-mirror array MMA can correspond to the example from FIG. 2; the description therein is referred to in this respect. However, deviating from FIG. 2, the side faces SF1, SF2 at the edge regions of the mirror substrates SUB1, SUB2 do not run perpendicular to the respective mirror surface MS1, MS2 but obliquely thereto at an angle deviating significantly from 90°. Specifically, the first side face SF1 includes an acute angle W1 of less than 90° with the assigned mirror surface MS1, wherein W1 can be in the range from 50° to 80°, for example. The directly opposite second side face SF2 includes an obtuse angle W2 with its assigned mirror surface MS2, the angle for example potentially being of the order of magnitude of 100° to 130°.

In the example, the absolute values of the deviation angles from 900 are the same on both sides, and the side faces are plane. The side faces SF1, SF2 delimit a gap SP, which extends obliquely in relation to the adjacent mirror surfaces MS1, MS2 and accordingly also extends obliquely in relation to the principal direction of incidence HE of the EUV radiation. The gap SP has a gap width SB which, at each position along the gap SP, corresponds to the clear width between the side faces measured in a plane perpendicular to the global mirror normal NOR.

The gap SP extends in the depth direction (parallel to the mirror normal NOR) between an entrance-side first gap opening SO1 in the region of the reflection coatings REF and a second gap opening SO2 on the opposite back side of the mirror substrates, and hence on the side facing the base elements. If the mirror elements are in their neutral position (as shown in FIG. 3), then the gap width SB between the first gap opening SO1 and the second gap opening SO2 is substantially constant; when there is a relative tilt, a gap width that varies in the depth direction sets in.

On account of the oblique orientation of the gap SP, a lateral offset LV, which for example can be measured between the ends of the gap openings located on the side of the first mirror substrate SUB2, arises between the first gap opening SO1 and the second gap opening SO2 in the direction in which the gap width SB is measured. The lateral offset LV may correspond to the gap width but is greater than the gap width SB in the exemplary case, for example by at least 10% or by at least 20% or by at least 30% or more. The consequence thereof is that EUV radiation incident on the mirror elements in the principal direction of incidence HE is blocked in its entirety by the mirror substrates SUB1, SUB2, and so no EUV radiation can reach the intermediate space ZR between the mirror substrates SUB and the base elements BE in this direction of incidence. More precisely, the EUV radiation incident on the gap SP will only be incident on the upper part of the side face SF2 of the second substrate, where it can be absorbed.

In the exemplary case, the lateral offset is dimensioned such that no EUV radiation from an angle of incidence range of 20° about the principal direction of incidence HE can reach directly through the gap into the intermediate space ZR behind the mirror substrates. Thus, the oblique arrangement of the gap leads to the gap being a radiation trap which prevents EUV radiation from radiating directly into the intermediate space behind the mirror substrates.

This particular shape of the edge regions of the mirror substrates creates corrosion protection structures that are integrated in the mirror substrates and overall leads to a substantial reduction in the rate of corrosion on the components located behind the mirror substrates SUB1, SUB2, etc., since no hydrogen ions are generated in this intermediate space on account of the lack of incoming high energy EUV radiation. A small corrosive attack might be caused by hydrogen ions which are created in the region in front of the mirror surfaces MS of the mirror elements and which find their way through the gaps SP on account of diffusion.

Incidentally, the oblique position of the gap is dimensioned such that complete blockage of EUV radiation radiated directly into the region behind the mirror substrates is provided for all tilt angles of the adjacent mirror substrates SUB1, SUB2 in the range of their respective admissible tilt ranges. The angles W1, W2 or the oblique position of the gap can be adapted locally to a direction of incidence prevalent there.

Figure 4:
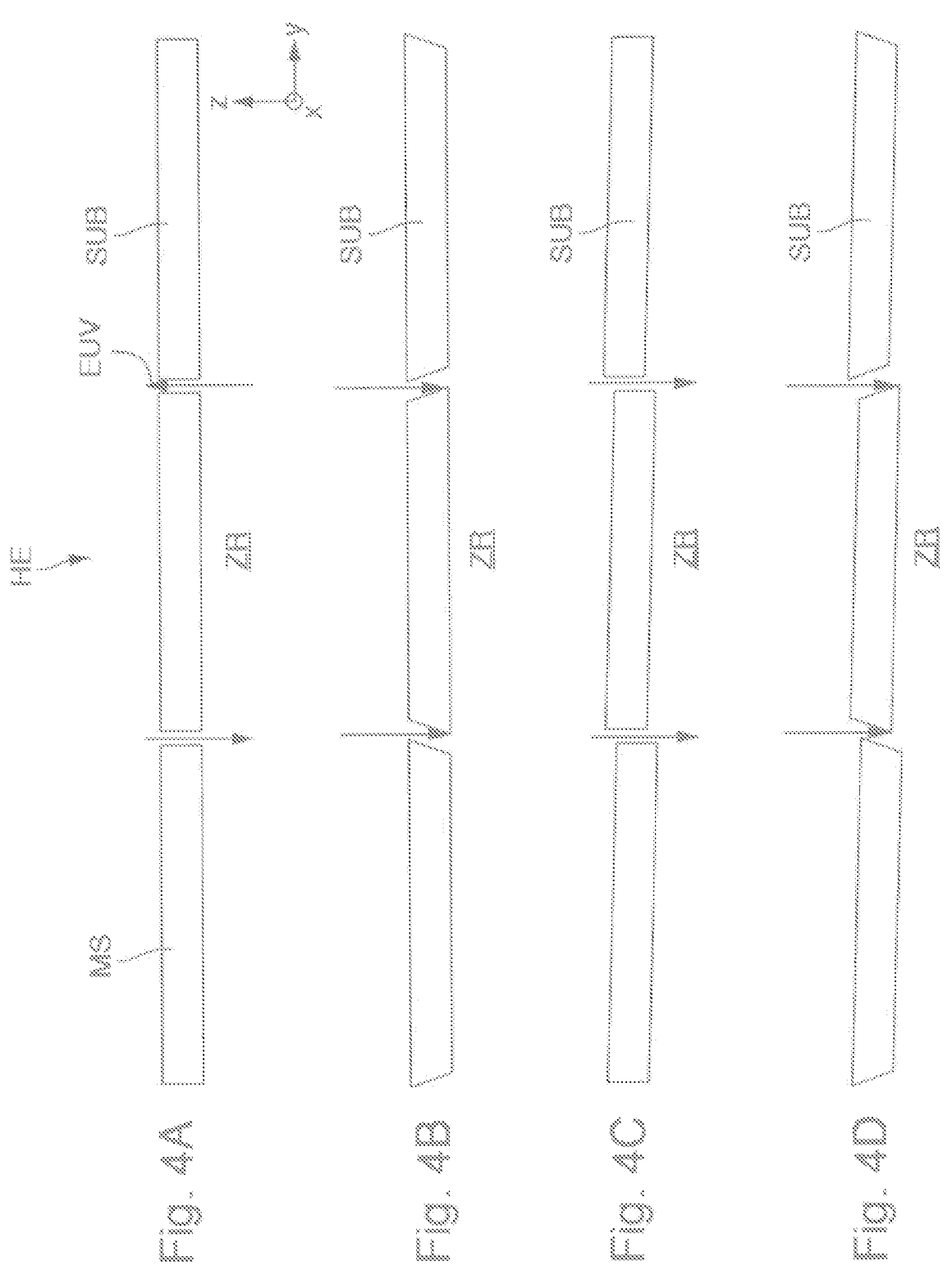
FIGS. 4A to 4D illustrate the shielding effect of oblique gaps in comparison with gaps with a perpendicular extent from the prior art.

Schematic FIGS. 4A to 4D provide a clear overview of the shielding effect of oblique gaps in comparison with gaps with a perpendicular extent (not at an oblique position) from the prior art. EUV radiation (arrows) is incident from the radiation entrance side (at the top in the figure) in a manner parallel to the principal direction of incidence HE, which runs parallel to the z-axis (height axis) of the mirror coordinate system that is stationary with respect to the carrier. FIG. 4A shows a conventional mirror arrangement, whose adjacent mirror elements are in their zero position. In this case, the mirror surfaces MS are located in a common plane and are aligned parallel to the xy-plane of the mirror coordinate system. The thickness of the arrows denoted by EUV indicates that a relatively large amount of EUV radiation from the front side (mirror surfaces MS) reaches the intermediate space ZR located therebehind. FIG. 4C shows the conventional arrangement, in which the adjacent mirror elements are now uniformly tilted from the zero position by a few degrees. Although this makes the effective gap widths slightly smaller, a relatively large proportion of the EUV radiation still reaches behind the mirror substrates SUB.

FIGS. 4B and 4D show comparable setups with exemplary embodiments in which the immediately adjacent mirror substrates SUB in each case have a trapezoidal form in cross section, the shorter sides of which are located on the light entrance side and the light exit side in alternation, with the result that gaps SP extending obliquely in relation to the mirror surfaces arise between the immediately adjacent mirror substrates. The reduced thickness of the radiation arrows EUV indicates that this blocks a significant proportion of the EUV radiation incident in the normal direction (z-direction) from passing into the intermediate space ZR behind the mirror substrates, wherein complete shielding may possibly be obtained. As shown in FIG. 4D, the shielding effect is also present when the mirror elements are slightly tilted, in each case uniformly, in relation to the zero position. This may lead to certain gaps becoming undesirably larger as a result. If need be, this may be compensated for by further measures.

Figure 5:
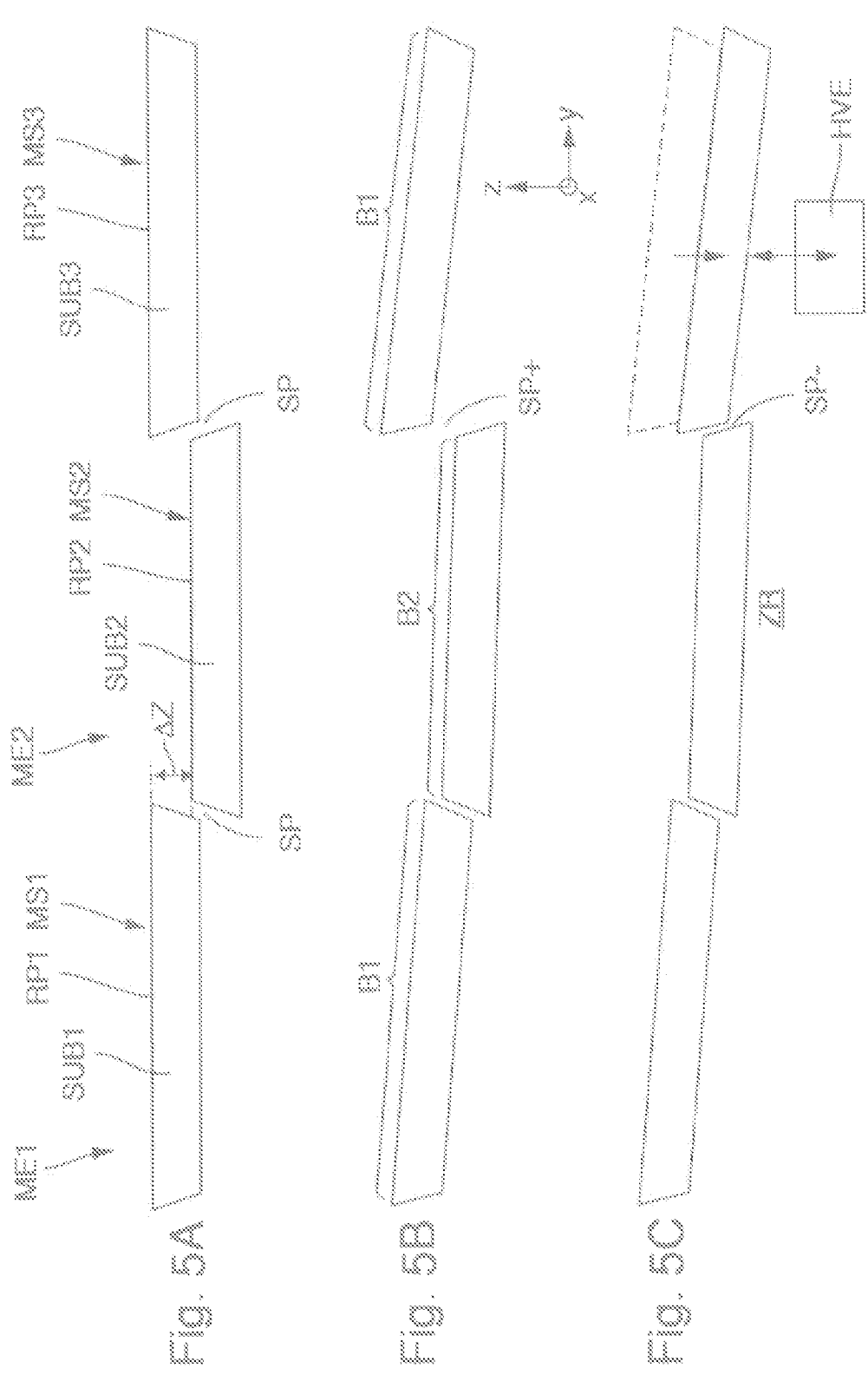
FIGS. 5A to 5C show examples in which immediately adjacent mirror elements are arranged offset from one another in terms of height on a permanent or intermittent basis.

Schematic FIGS. 5A to 5C are used to explain exemplary embodiments in which a contribution for better shielding of EUV radiation is achieved by virtue of immediately adjacent mirror elements being arranged offset from one another in terms of height either on a permanent or intermittent basis. In this case, the height direction denotes the z-direction of the mirror coordinate system, which is aligned more or less exactly parallel to the principal direction of incidence of the EUV radiation. FIG. 5A schematically shows the mirror substrates SUB1, SUB2, SUB3 of three mirror elements ME1, ME2 and ME3 located directly next to one another, which alternately have two different widths, specifically B1 and B2, in the region of their mirror surfaces MS1, MS2, MS3 in each case measured in the direction (y-direction) in which they are located next to one another. In the outer mirror elements ME1 and ME3, the oblique side faces facing one another are oriented such that the substrate back side facing the carrier structure (bottom) is narrower than the mirror side. The situation is reversed in the mirror element ME2 in between; in this case, the mirror surface is narrower in the width direction than the substrate back side. Thus, the mirror substrates are arranged in alternation with different orientation of the wider and narrower sides thereof.

The mirror elements ME1, ME3, whose mirror surface in the width direction is greater than the substrate back side, have in relation to the mirror substrates with another orientation a height offset toward the light entrance side in the height direction. The height offset $\Delta z$ can be defined as a distance, measured in the height direction, between a reference point RP1 defined by the first mirror surface MS1 at the geometric center of the mirror surface and the corresponding reference point RP2 defined by the immediately adjacent second mirror surface MS2. As a rule, the height offset is smaller than the thickness of the mirror substrate, measured in the height direction, and can be between 20% and 80% of this thickness, for example. The height offset is also present, with identical or similar size, in the region of the gap SP present between the mirror elements. It is evident from FIG. 5A that a complete block of the EUV radiation entering in the normal direction is achieved in the case of mirror elements situated in the zero position. The height offset allows the tilt angle ranges of the individual mirrors available without collision to be increased since the disturbance contours formed by the respectively other mirror elements are located further apart than in the case of an arrangement of the mirror substrates at a common level (cf. FIG. 5B).

In comparison with the embodiment presented previously, the relative height offset also enables a more pronounced trapezoidal shape along the depicted section in the case of an unchanged tilt angle, whereby the effective lateral offset is increased.

The relative height offset of adjacent mirror elements may be fixedly prescribed. In that case, the mirror elements can be arranged alternately at two different levels, wherein two mirror substrates at a common height position in each case have a mirror substrate at the other height position located therebetween. Thus, two height levels are provided in alternation. The relative height offset can also be adapted to the expected tilt range (defined by the optical design) of the adjacent mirror elements, and hence contain further height levels.

FIG. 5C shows another exemplary embodiment with a height offset between adjacent mirror substrates. The multi-mirror array of the exemplary embodiment in FIG. 5C is equipped with a controllable height adjustment device HVE for the reversible, continuous height adjustment of individual mirror elements in relation to adjacent mirror elements in response to control signals. This can be used, inter alia, to implement a concept whereby the height position (position in the height direction or z-direction) is set depending on the actual tilt position and height position of adjacent mirror substrates. In this respect, FIG. 5C shows the three mirror substrates SUB1, SUB2, SUB3 at the same tilt positions as in FIG. 5B. However, while a relatively large gap SP+ arises between the second mirror substrate SUB2 and the third mirror substrate SUB3 in FIG. 5B on account of the different tilt angles, the third mirror has been retracted with the aid of the height adjustment device (see double-headed arrow) in the variant of FIG. 5C and hence been brought closer to the height level of the immediately adjacent second mirror element ME2. As a result, the gap SP– in between becomes so narrow that the intermediate space situated therebehind is completely blocked for EUV radiation entering in the normal direction.

The displacement components of mirror elements which may be provided in addition to the displacements arising due to the tilt may run in the height direction only. However, it is also possible to design the actuator system such that displacements with a combination of displacements in the height direction and in lateral directions perpendicular thereto (y- and x-direction) are possible.

It is possible that the entire mirror unit (including the base element) is displaced in the height direction, e.g. by virtue of a piezo layer whose thickness can be modified in controlled fashion being located between the carrier structure and the base element. In an alternative or in addition, it is possible to realize the height adjustment by way of the actuator system of the parts of the MEMS structure located between base element and mirror substrate.

Figure 6:
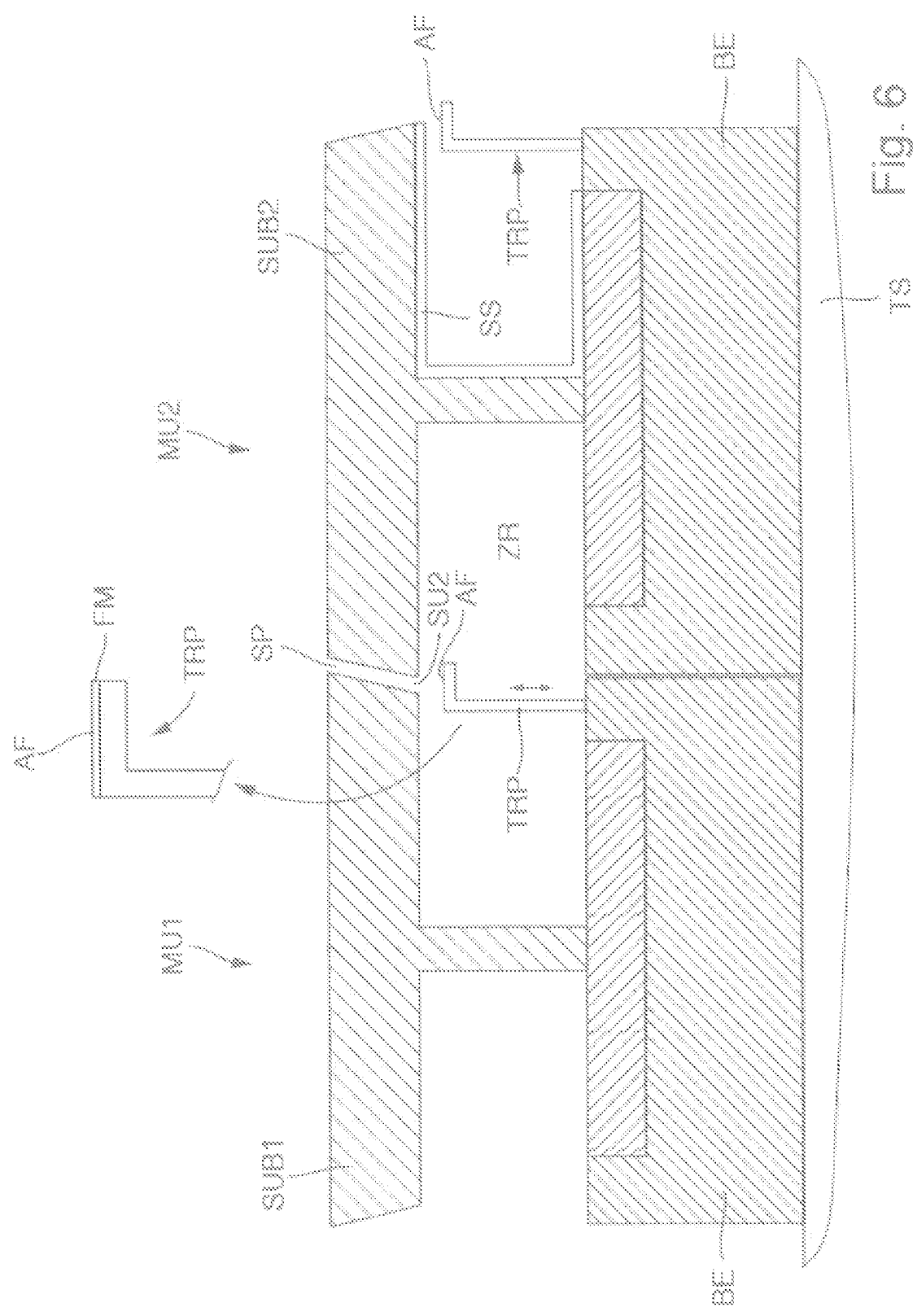
FIG. 6 shows an exemplary embodiment having corrosion protection structures in the form of radiation trap elements behind the gaps.

Schematic FIG. 6 illustrates further optional measures for reducing or avoiding EUV radiation radiating into the intermediate space ZR between the mirror substrates SUB and the carrier structure TS with the aid of corrosion protection structures at the individual mirror units. Shown are two immediately adjacent mirror units MU1 and MU2, whose mirror substrates SUB1, SUB2 have oblique side faces such that an obliquely positioned gap SP arises between the mirror substrates. Additionally, a portion of the MEMS structure, which acts as a radiation trap element TRP, is formed on each mirror unit. For example, a radiation trap element can be created integrally with a base element BE when structuring the component.

The radiation trap elements TRP, which are only depicted schematically, each have a radiation incidence surface AF aligned parallel to the xy-plane in the region immediately behind the carrier-side second gap opening of the gap SP, the radiation incidence surface being wider than the carrier-side gap opening SO2 and protruding somewhat beyond the latter on both sides. The radiation incidence surface extends along the gap, i.e. it is many times longer in its longitudinal direction running perpendicular to the plane of the drawing than in the width direction. The height spacing between the radiation incidence surface AF and the substrate back side is dimensioned such that the mirror substrates are able to tilt over their maximum tilt angle range without colliding with the radiation trap element. It is also possible to adapt portions of the radiation trap elements TRP in terms of height to the current tilt position of the mirrors located thereabove, in order to minimize the effective gap without collisions.

While the basic structure of the radiation trap element may include the material of the base element (silicon, for example), the radiation incidence surface can have special properties as a result of an appropriate coating with a functional material FM. Firstly, the functional material can be designed so that it has an absorbent effect for EUV radiation, with the result that the radiation trap element acts as an EUV absorber. In an alternative or in addition, the functional material can also be designed such that it acts as a recombination catalyst for the hydrogen ions and hydrogen atoms, with the result that hydrogen ions possibly penetrating through the gap are recombined there to form hydrogen atoms and these can be recombined to form hydrogen molecules, and thus become harmless in view of the risk of corrosion. It is evident that such radiation trap structures are also able to capture contamination particles possibly penetrating through the gaps and in this respect also serve for the protection of the structures located therebehind.

Radiation trap elements may also be provided in combination with conventional multi-mirror arrays (with perpendicular gaps) and serve as corrosion protection elements there.

A double-headed arrow in FIG. 6 depicts an optional embodiment, in which portions of the radiation trap elements are height-adjustable. The height setting of the respective radiation trap element may be actuated depending on the tilt positions and/or height positions of adjacent mirror elements, in order to set an optimal distance from the gap in each tilt position. For example, a piezo-actuator or a pneumatic actuator may be provided for the height adjustment. In an alternative to the arrangement of a radiation trap element on a base element, a fastening to the carrier structure in an intermediate space between adjacent base elements is also possible.

FIGS. 7A to 7F depict different examples of parts of a corrosion protection system which has corrosion protection structures in the form of a protection membrane MEM which comprises a gap covering portion AA bridging or covering the respective gap for each of the covered gaps. The gap is formed between two immediately adjacent mirror substrates SUB1, SUB2. The membrane MEM or the gap covering portion AA is carried by the mirror substrates SUB and is fastened to the mirror substrates to this end, at the radiation entrance side provided with a reflection coating (cf. FIGS. 7A to 7C) in the case of FIGS. 7A to 7C or at the back side of the mirror substrates (cf. FIGS. 7D to 7F) in each case, for example.

Figures 7A, 7B, 7C:
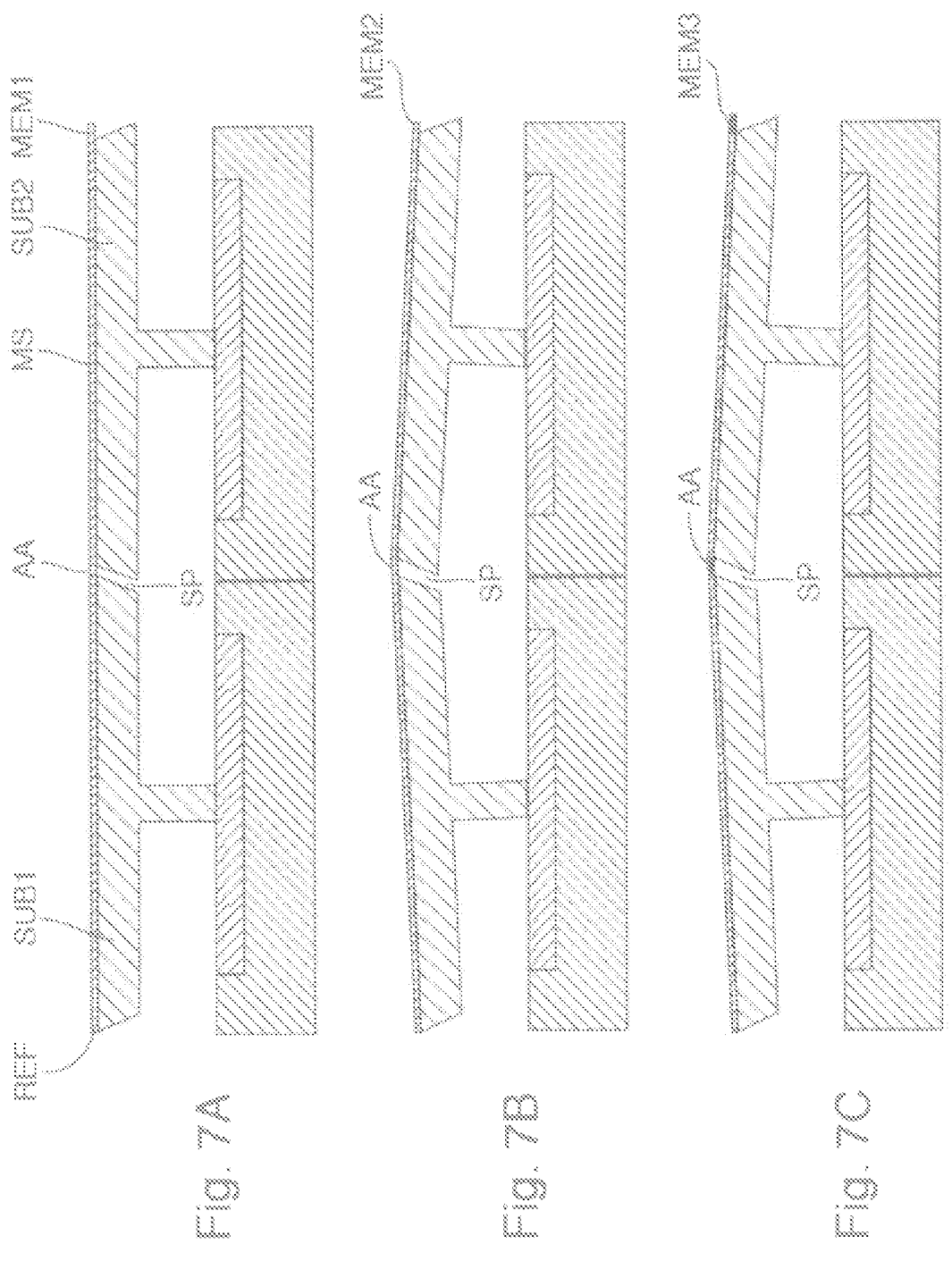
FIGS. 7A to 7F show exemplary embodiments having corrosion protection structures in the form of a protection membrane with gap covering portions, which is carried by the mirror elements.

The protection membrane MEM can be a flexible and/or slightly stretchable membrane, which can also follow the slight tilting movements of the mirror elements with respect to one another or compensate for possible dimensional changes in the region of the gap (cf. FIG. 7B). For example, the protection membrane may comprise a thin metal foil and/or a thin polyimide foil or be formed by such foils.

In the example of FIG. 7A, the protection membrane MEM1 is so thin and made of such a material that there is a high transmissivity for EUV radiation. Hence, EUV radiation can penetrate into the gap even in the region of the radiation covering portion AA, but it is largely or entirely blocked there on account of the oblique position of the gap. Nevertheless, the membrane protects the MEMS structure therebehind from degradation by corrosion since an ingress of hydrogen ion-containing plasma through the gap into the intermediate space therebehind is completely prevented by the membrane. The membrane MEM1 can have the same transmission properties over a large area. What this can achieve is that the reflectivity is only slightly reduced, even at the mirror surfaces covered by the membrane.

It is also possible to design the protection membrane as a laterally structured membrane; in its broadest sense here, this means that the membrane has regions with different properties in accordance with a given structure due to production reasons. A structured membrane MEM3 is attached to the reflective side of the mirror elements in the example of FIG. 7C. The latter extends over all mirror surfaces and bridges the in-between gaps using corresponding gap covering portions AA. The protection membrane is structured such that the membrane has a substantially lower EUV transmission in the region of the gap covering portions AA than in the regions located in the region of the mirror surfaces. In the region of the gap, the latter can be shielded at least in part against penetrating EUV radiation as a result, and so not only are penetrating contaminations and plasma blocked, but the possible creation of new hydrogen ions in the intermediate region between mirror substrate and base element is also reduced or prevented.

A structured protection membrane can be increased by virtue of the membrane, following the application on the mirror elements carrying the membrane, being removed from the region of the reflection coatings, or thinned there to such an extent by etching or the like, that there is no, or only just still a small, reflectivity-reducing effect. In the region of the gap covering portions AA, the membrane can remain to such an extent that its opposing edge regions can be fastened to the edge regions of the adjacent mirror substrates that are adjacent to the gap.

In the examples of FIGS. 7A to 7C, a protection membrane is fastened to the reflective side of the mirror elements, i.e. to the front sides of the mirror substrates. This is not mandatory. A gap covering portion can also be fastened to the back side of the mirror substrates adjoining one another, with the result that the second gap opening is covered (cf. FIG. 7D). In that case, contaminating material can still penetrate into the region of the gap, but penetration into the intermediate space therebehind is prevented. The radiation-blocking effect can also be maintained in the case of an appropriate design of the gap covering portion. In that case, the reflective surface of the mirror elements is free from membrane parts, which can be desirable in relation to obtaining high reflectances.

Figures 7D, 7E, 7F:
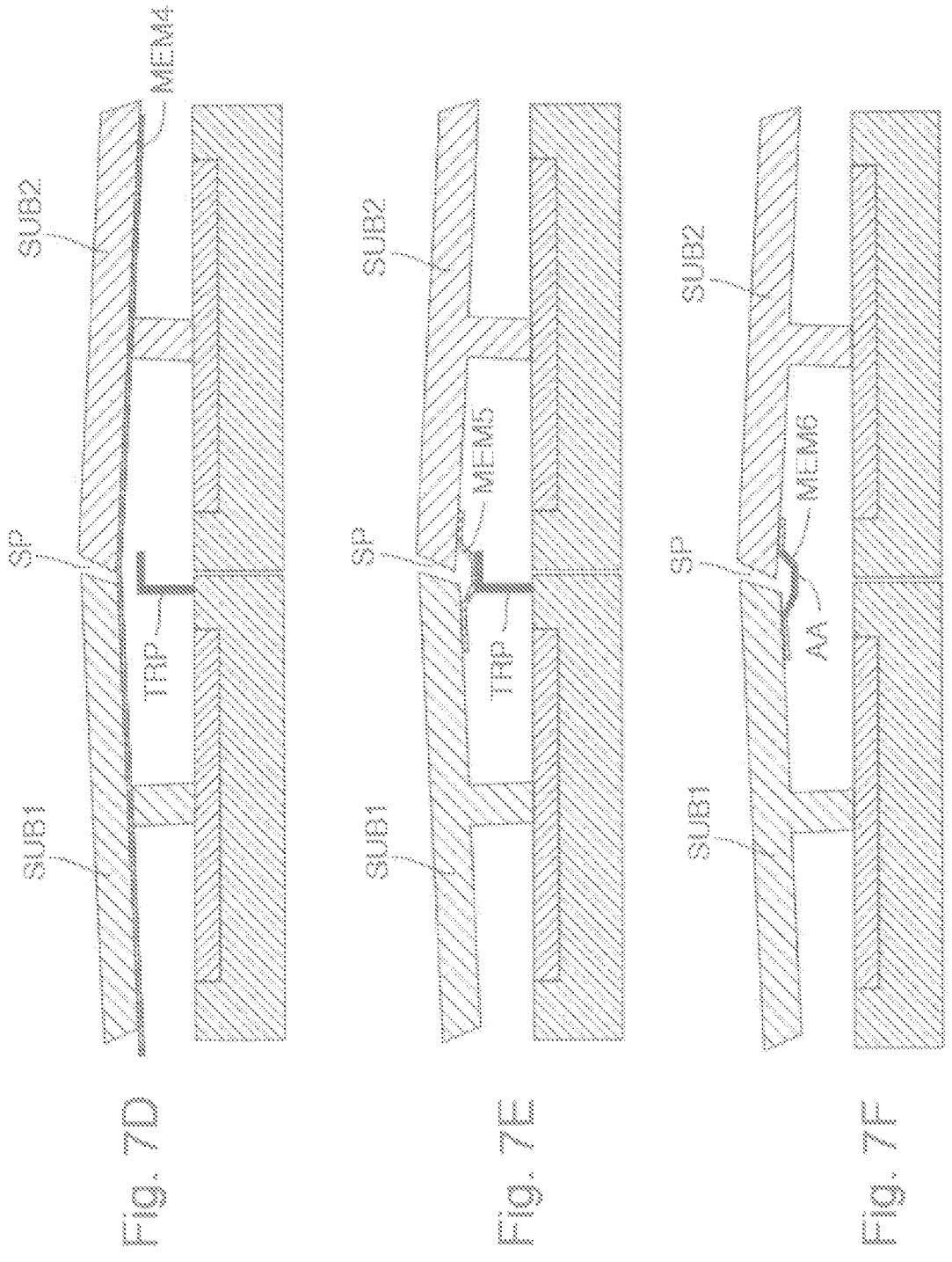

In the variant of FIG. 7E, a protection membrane MEM5 is arranged between the back side of the mirror substrate and a back side of the radiation trap element. In this case, the protection membrane is fastened firstly to the back sides of the adjacent mirror substrates SUB1, SUB2 and, by way of an in-between portion, to the front side of the radiation trap element TRP. The latter is mounted to be movable in terms of height. If the adjacent mirror elements are tilted in relation to one another, a tilt position-dependent height adjustment of the radiation trap element TRP can be achieved by the layer stress of the protection membrane MEM5 between the mirror unit and the radiation trap element, by virtue of the radiation trap element being carried along in the z-direction. 5 FIG. 7F shows a variant of the arrangement from FIG. 7E without a radiation trap element.

In this case, the protection membrane MEM6 is fastened to the back sides of the adjacent mirror substrates SUB1, SUB2 and bridges the gap region with a slightly sagging absorbent portion AA, which absorbs EUV radiation passing through the gap. Like an elastic seal, the protection membrane can compensate a possible increase in gap size when the mirror substrates are tilted, without putting a tensile stress on the fastening positions or counteracting the tilt.

Figures 8A, 8B:
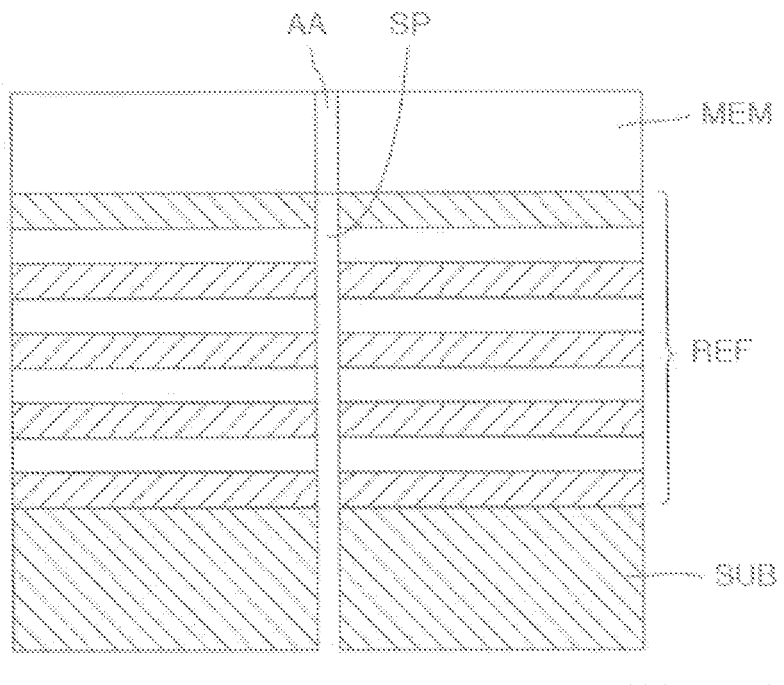
FIGS. 8A and 8B show two options for attaching a protection membrane in the region of the reflection coating.

Schematic FIGS. 8A and 8B each show schematic sections through adjacent mirror substrates SUB in the region of an in-between gap SP in the region of the reflection coating REF and the protection membrane MEM. In this case, FIG. 8A shows, in enlarged fashion, the arrangement of the protection membrane also chosen in the examples of FIGS. 7A to 7C. In this case, the layer sequence of the reflection coating REF is situated on the front side of the mirror substrate SUB. Then, the stabilized protection membrane MEM, which covers the gap SP with its gap covering portion AA, is applied to the free outer side of the reflection coating.

FIG. 8B shows an alternative of a corrosion protection structure with a protection membrane MEM. The adjacent mirror substrates SUB1, SUB2 delimit the in-between gap SP. The protection membrane MEM is initially applied directly to the free surface of the mirror substrates (or with the interposition of one or more functional layers). Then, the layer sequence of the multi-layer reflection coating REF is applied to the outer side of the protection membrane MEM, with the result that the mirror surface MS is formed by the free surface of the reflection coating REF. The protection membrane MEM also covers the gap with its gap covering portion AA in this case, but the reflective effect of the reflection coating is not impaired by the protection membrane. Hence, no consideration has to be given to particularly low EUV transmissions when selecting and designing the protection membrane. Instead, the EUV transmission can be relatively low such that the radiation-blocking effect is large. The reflectivity of the reflection coating is not impaired by such corrosion protection structures.

In some embodiments, the corrosion protection system has only one of the aforementioned types of corrosion protection structures. For example, it may be sufficient if only the obliquely positioned gaps are provided. However, corrosion protection systems which combine two or more of the aforementioned corrosion protection structures will frequently be desirable. For example, the height adjustment of individual mirror substrates may be provided in combination with the radiation trap structures and/or in combination with a protection membrane.

Further measures for avoiding degradation as a result of corrosive attacks may be provided on functional structures of the mirror units. For example, provision can be made for the MEMS structures at least in some or all of the surface regions exposed to a corrosive attack to be manufactured from a material which is substantially more resistant to a corrosive attack by hydrogen ions than the silicon typically used for MEMS structures. For example, provision can be made of corrosion protection layers made of aluminum oxide or aluminum, for example on the back side and the side walls of the mirror substrate, on the plunger which may carry the mirror substrate, and on parts of the base elements.

Examples of such corrosion protection layers SS are shown schematically to the right in FIG. 6.

FIGS. 9A to 9C and FIGS. 10A to 10C are now used to explain two options for the production of multi-mirror arrays with obliquely positioned gaps between adjacent mirror elements. FIG. 9A shows a schematic section through a finished micromirror array MMA along a row or column of mirror units which are attached to a carrier structure TS in the form of a silicon plate. Each mirror unit has a mirror element ME and a solid stand or post STD attached centrally thereto. The carrier structure TS shown only schematically comprises the mechatronic parts. These include inter alia the flexible suspension, the actuators, optionally sensors, e.g. orientation sensors, etc. The mirror surfaces MS are formed on the side facing away from the carrier structure. In the cross-sectional plane shown, the mirror substrates have a substantially trapezoidal cross section, with the trapezoids being oriented in alternating fashion, in such a way that every second mirror element has the same orientation between the narrower side and the wider side, with the result that the oblique gaps SP are present between the mirror elements.

The exemplary production process comprises two production steps, with a group of mirror units MU with the same orientation being fastened, together with the suspension system, to the carrier structure by bonding in each production step. FIG. 9B illustrates the first manufacturing step. A holding substrate HS in the form of a plane wafer is provided with a separation layer SEP on one side. A group of first mirror elements MU1 with the same orientation of the trapezoid shape is attached thereto. In the exemplary case, each of the mirror elements are oriented such that the front side, to which the mirror coating should be applied, is smaller than the back side of the mirror substrate, to which the post STD is attached. Gaps for the oppositely oriented second mirror substrates SUB2 remain between the individual mirror units in the shown direction of the section and obliquely thereto. The mirror elements still held by the holding substrate are then securely connected to the top side of the carrier structure TS under the action of pressure and temperature in a bonding step (e.g. eutectic bonding or thermal bonding), with the result that the central posts STD are fastened to the carrier structure. Then, the separation layer is heated or dissolved to such an extent that the holding substrate can be removed. In an alternative, the holding layer with the holding substrate can be etched away chemically or by plasma etching.

Then, in a second step (FIG. 9C), the second group of second mirror units MU2 is connected to the carrier structure in analogous fashion. The second group in each case comprises those second mirror substrates whose wider sides are now attached to the holding substrate HS, and the narrower side with the suspension faces the carrier structure TS. The second bonding step is possible since the gaps between the first mirror units MU1 of the first group, which were applied in the first step, widen upwardly, with the result that the oppositely oriented second mirror units to be arranged in between can all be inserted in one step.

Figures 10A, 10B, 10C:
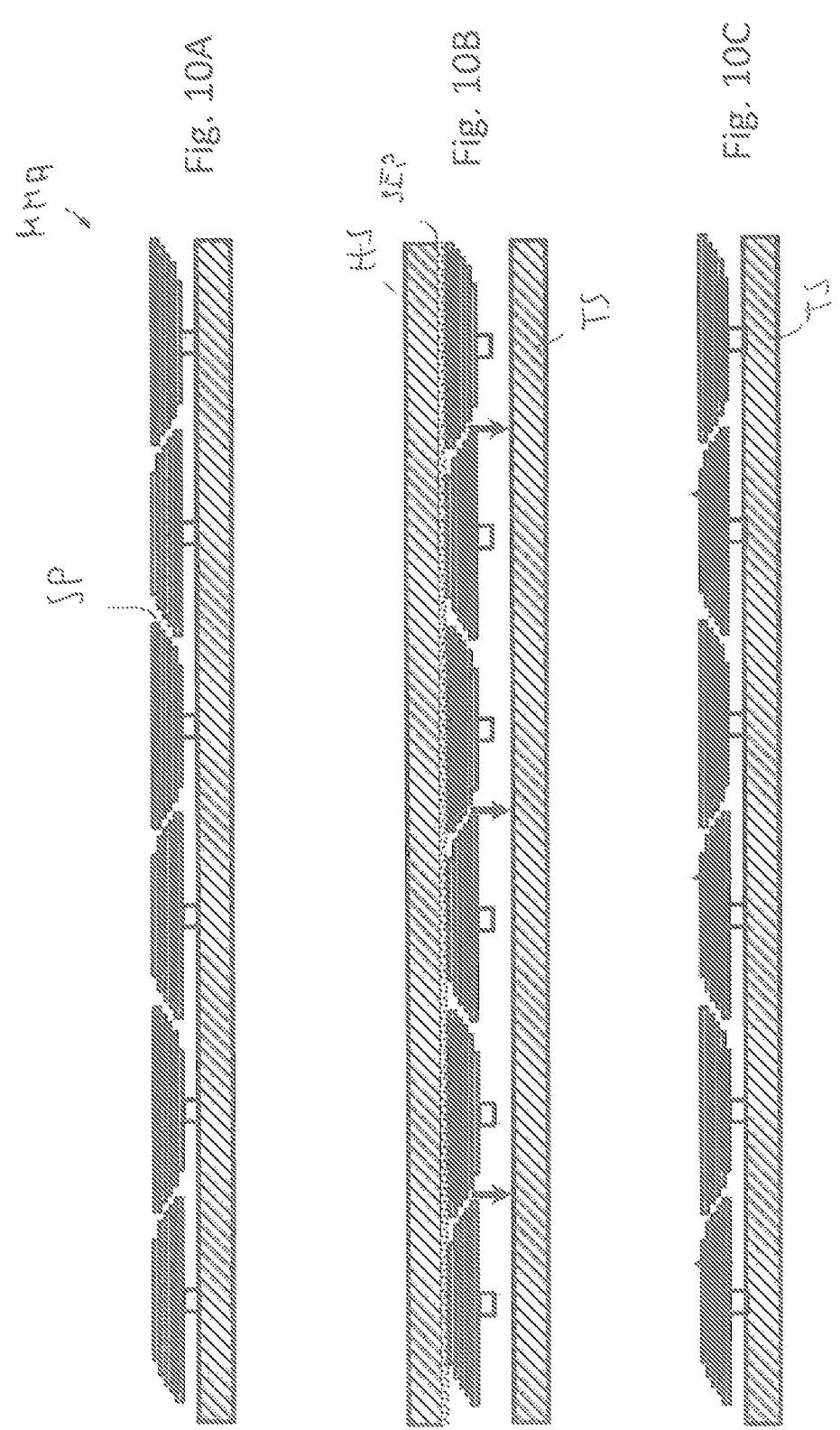
FIGS. 10A to 10C schematically illustrate a second variant of a production method for a multi-mirror array with oblique gaps.

FIGS. 10A to 10C are used to explain a second variant, which is implemented in the style of additive manufacturing. In this case, stepped mirror substrates arise on the side faces by virtue of layers of different lateral extent lying on top of one another being created in succession in order to form a mirror substrate in each case. Again, FIG. 10A shows a section through the finished multi-mirror array MMA with obliquely oriented gaps between the individual mirror elements. In this case, too, the mirror elements which are substantially trapezoidal in the section and which have an alternating orientation between the wide side and the narrow side are arranged such that a respective obliquely positioned gap with stepped lateral boundaries arises between immediately adjacent mirror elements.

Together with the suspension attached thereto, the mirror elements are created on a holding substrate HS in a first step (FIG. 10B). The latter is initially coated with a separation layer SEP. Subsequently, a first layer is applied, which initially includes throughout the material provided for the mirror substrates, for example silicon. This first layer is then structured in a lithographic process at those points where the gaps between adjacent mirror units are intended to arise, with material being removed by etching. The gaps arising in the first layer are subsequently filled with sacrificial material (e.g. $SiO_2$). This is followed by a planarization step in order to create a plane surface for the application of the next layer, the surface being formed in part by the material of the first layer and, in the region of the gaps, by the sacrificial material.

Then, a continuous second layer made of the material chosen for the formation of the mirror substrates (silicon, for example) is applied. In the region of the gaps, the latter is then also structured in a lithography process by virtue of material of the second layer being removed there by etching. Depending on whether an oblique gap extending to the left or one to the right is intended to be created, the regions of the second layer intended to be removed by etching are located either laterally to the left or laterally to the right of the corresponding regions of the first layer. The regions which are then empty following the etching step are filled with sacrificial material, and there follows a further planarization step. Following an appropriate number of repetitions of this structuring process, the mirror substrates are available in the alternating arrangement of the gaps, which are still filled with sacrificial material. The application or creation of the suspension structure is followed by a bonding step (FIG. 10B), by which the individual mirror elements are connected (bonded) to the carrier structure TS under the action of force and temperature. The volume regions filled with sacrificial material are etched after the bonding step, in order to remove the sacrificial material. Subsequently, the material of the separation layer SEP is also removed, with the result that the front faces of the mirror substrates are exposed. These are subsequently coated with a reflection coating. FIG. 10C shows a section through the completed multi-mirror array.

Subsequent FIG. 11ff. are used to explain, by way of example, further approaches for solving the above-described issues. For reasons of clarity, the same reference signs as in the examples above are used for features which are equivalent or similar from a structural and/or functional point of view. Among other things, the solutions consider the insights set forth below.

The pose and spatial extent of the regions behind the mirror surfaces which radiation, e.g. the EUV radiation, can reach directly or indirectly following reflection depend, inter alia, on the size of the mirror elements, their thickness, their height above the base plane formed by the surfaces BE-O of the base elements, the height of the mirror surface above the position of the individual tilt axes, the maximally attainable tilt angles, and on the dimensions and positions of the gaps SP and on the angle distribution of the incident radiation. The surface regions and/or volume regions exposed to the radiation penetrating into the intermediate region may become larger if the mirror elements are tilted in relation to one another.

An incident that may arise during the coating processes for creating the reflective coating REF on the front face VF of the mirror substrates SUB is that coating material also penetrates into the gaps, and hence the side faces SF may obtain a coating which reflects EUV radiation to a greater or lesser extent.

The EUV rays reflected at the side faces SF may change their direction of propagation relative to the direction of incidence significantly, wherein the extent of the deflection angles depends, inter alia, on the angles of incidence and the tilt angles of the mirror elements. As a result, EUV radiation may also be incident on those regions of the surface BE-O of the base elements which are in the shadow of the mirror elements in the absence of side face reflection.

As a result, it may be the case that the "radiation-protected" surface components and volume components not exposed to the direct radiation in effect are smaller than in the case of an ideal configuration without side face reflection. This may amplify the issues mentioned at the outset, such as radiation-induced heating, degradation under the influence of radiation due to corrosion, electrical malfunctions on functional electrical parts, etc., and use durations reduced in association therewith.

Figures 11, 12A, 12B, 12C:
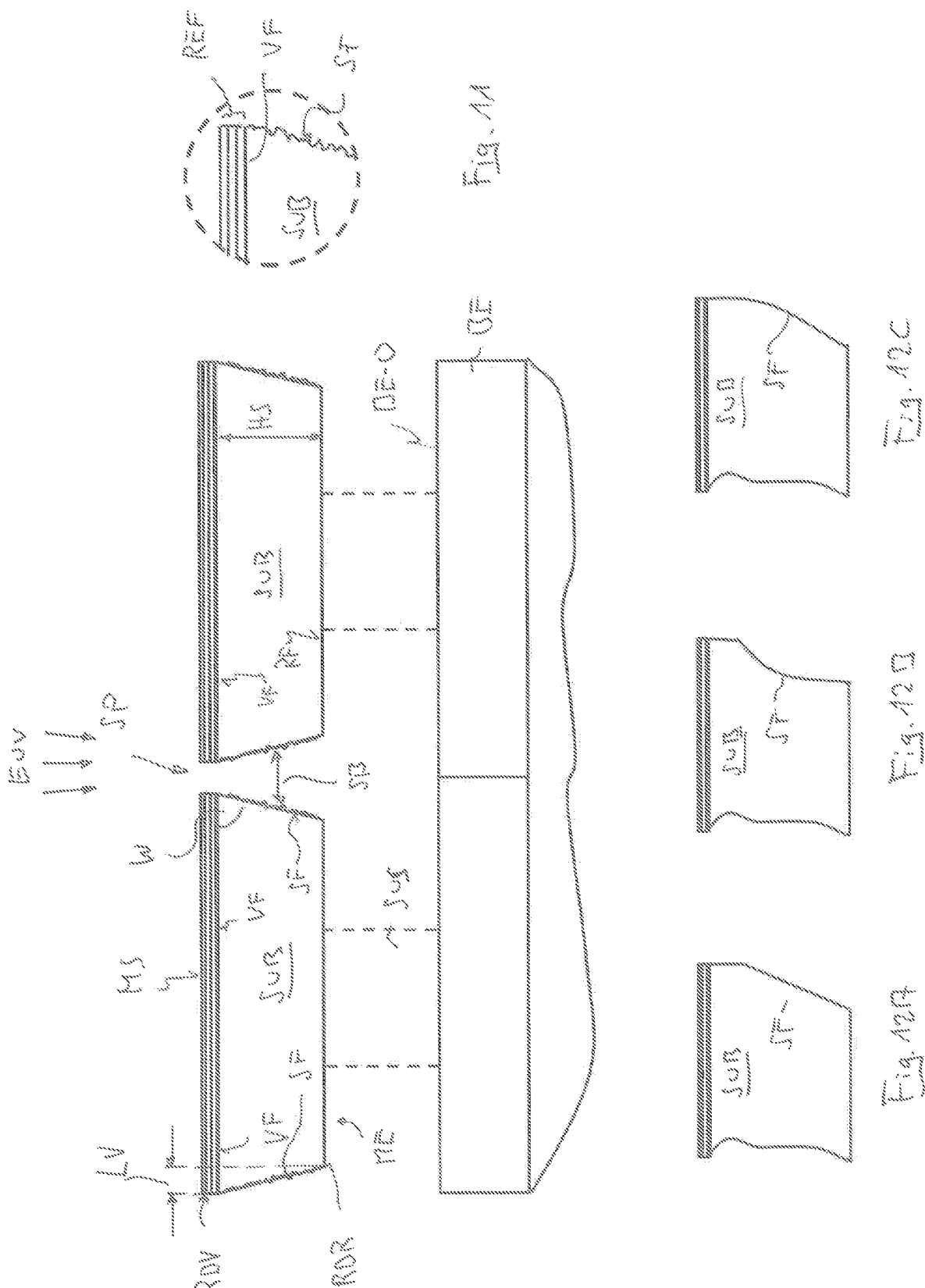
FIG. 11 schematically shows an exemplary embodiment in which the mirror substrates comprise obliquely positioned side faces such that the gap width increases in the direction of the base element.
FIGS. 12A, 12B, 12C show alternative design options for obliquely positioned side faces.

In the exemplary embodiment of the EUV multi-mirror array MMA in FIG. 11, the mirror units MU in terms of their basic components (base element BE, mirror element ME, flexible suspension system SUS, reflection coating REF) largely correspond to the prior art described in the context of FIG. 2, which is why reference in this respect is made to the description provided in that context.

Substantial differences thereto are found in the edge region of the mirror elements in the region of the side faces SF of the mirror substrates SUB. At the edges of the mirror surface, i.e. at the transition between VF front face and side face SF, the side faces are not aligned substantially perpendicular to the reflective front face but are each oriented obliquely with respect to the assigned mirror surface systematically at an angle W deviating from 90°. It thus holds true in the process that the front face VF provided with reflection coating REF has a greater surface area than the opposite side of the mirror substrate, specifically the back face RF facing the base element BE. What this achieves in the case of the approximately plate-type mirror substrate overall is that the lateral or outer edge RDR of the back face is inwardly recessed by a lateral offset LV in relation to the outer edge RDV of the front face VF at all circumferential positions. As a result, the mirror substrate obtains a trapezoidal form with the wider base toward the reflective front face in the shown cross-sectional plane. The mirror substrates adjacent in all adjacent directions also have the same form, with the result that a respective gap SP arises between adjacent mirror substrates, the gap width SB of which increases from the radiation entrance side located on the plane of the front faces toward the radiation exit side facing the base element.

In the exemplary case of FIG. 11, the side faces are macroscopically plane in each case, with the result that they are angled at a uniform angle W in relation to the front face. There are also exemplary embodiments in which the oblique position is present only in sections, with the result that there are also portions which are oriented more or less perpendicular to the front face (cf. FIG. 12A). Side faces may also have convex (cf. FIG. 12C) or concave (cf. FIG. 12B) curvature, at least in sections.

The oblique position angle W can be adapted to the application. As a rule, the deviations from 90° are relatively small, for example between 2° and 10°, in particular between 3° and 8°. Depending on the thickness or height HS of the mirror substrate, this may lead to lateral offsets LV of the order of magnitude of a few micrometers, for example of between 2 μm and 10 μm. For example, the lateral offset may make up between 3% and 10% of the thickness HS of the substrate. Deviations from these exemplary dimensions are possible. Certain desirable technical effects of this configuration are explained in detail below.

The technical effect of the described oblique positioning of the side faces should be explained hereinbelow on the basis of FIGS. 13 and 14. To estimate the effects, the inventor performed ray tracing on an exemplary model system in order to ascertain the regions behind the mirror substrate SUB which the EUV radiation or DUV radiation can reach, either directly or via reflection at side faces, for a given angle of incidence distribution. In this case, a reference example of a plate-type mirror substrate with perpendicular side faces was considered in each case and, in comparison therewith, an exemplary embodiment with obliquely positioned side faces. Without loss of generality, a value of BV=950 μm on the front face and a value of BR=940 μm on the back face was assumed for the width B between opposite side faces, with a thickness HR of 75 μm. Thus, the lateral offset LV was 5 μm on each side. A value of 250 μm was assumed as a typical size for the height of the back side of the mirror substrate in relation to the base plane (surface BE-O of the base elements).

Figure 13:
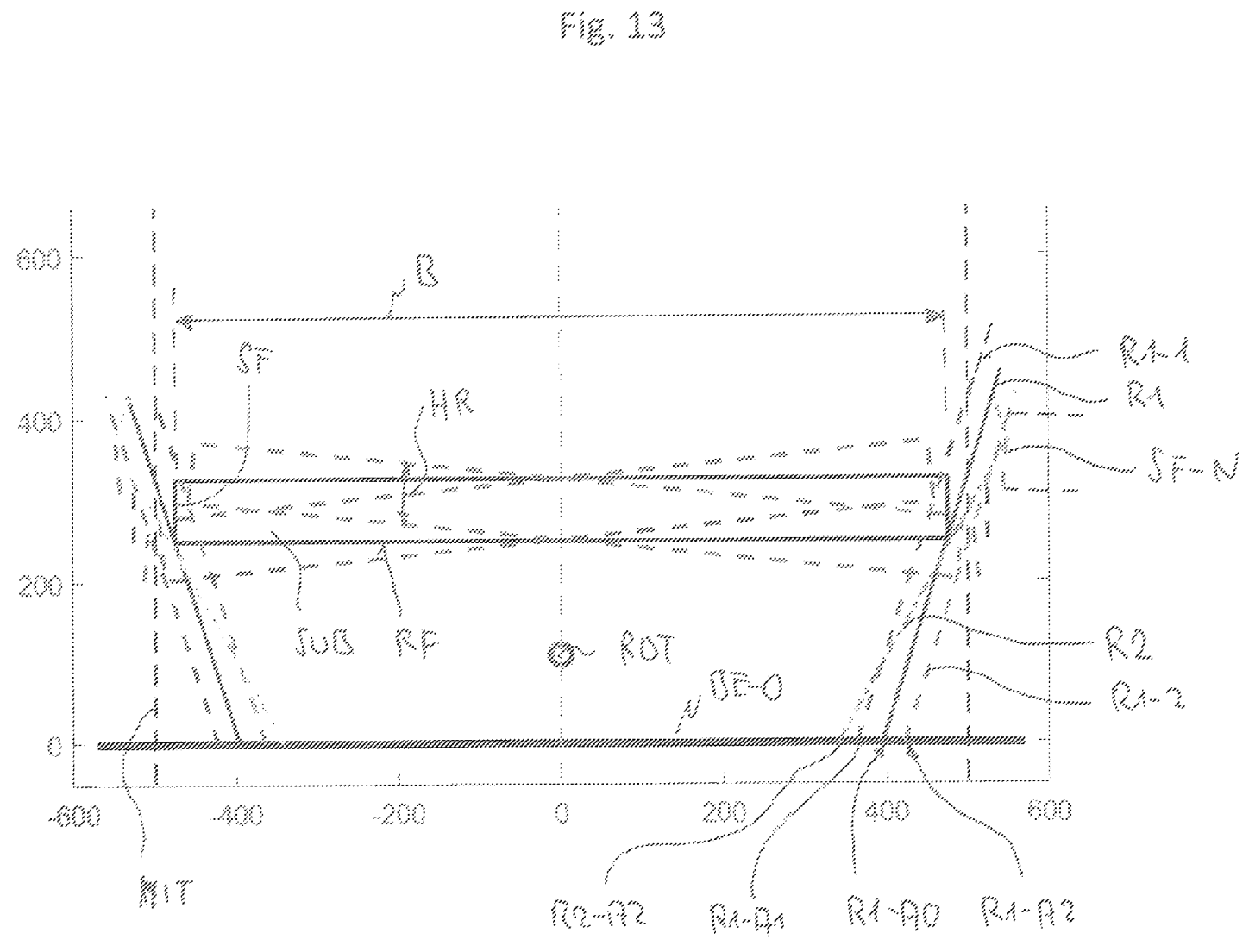

The diagram in FIG. 13 illustrates the model system, in which the substrate SUB in its non-tilted neutral position is shown as a flat rectangle with a solid line. Dashed lines are used to display the extremal values of the tilts to the left and right. Maximum assumed tilt angles were of the order of magnitude of 100 mrad toward each side. As a rule, the tilt angles per side may be located in the range from 50 mrad to 150 mrad, for example. The tilts are implemented about the tilt axis or axis of rotation ROT, which is located between mirror element and base plane (width coordinate 0 on the y-axis of the diagram) at a height of approx. 125 μm. The vertical dashed lines at x=−500 and x=500 μm correspond to the center planes MIT of the gaps between adjacent mirror units and hence to the edges of the region of an individual mirror unit.

An angle of incidence spectrum whose angles of incidence are located between normal incidence (an angle of incidence of 0° in relation to the surface normal of a non-tilted mirror substrate) and a maximum angle of incidence of the order of magnitude of approx. 10 to 20° is assumed for the incident (EUV) radiation.

Different representative rays are plotted in the edge region of the mirror substrates.

The solid line R1 represents the most disadvantageous ray of a direction of incidence spectrum in the case of a non-tilted mirror substrate. This ray R1 is just in tangential contact with the lower edge of the mirror substrate formed between side face and back face and incident on the base plane BE-O at the location R1-A0. If the mirror element is tilted to the left, the right back edge of the mirror substrate moves inwardly in the direction of lower absolute values of the spatial coordinate x. As a result, there is a ray R1-1, which has the same angle of incidence as the ray R1, but is now in tangential contact with the back edge of the tilted mirror substrate and is incident on the base plane at the location R1-A1. On account of the tilt of the mirror to the left, this location is closer to the center of the mirror element (at x=0). This illustrates that tilting of the mirror may reduce the size of the surfaces or volumes arranged around the center of the mirror unit which are not irradiated in the base plane BE-O.

If the mirror substrate is tilted to the right, the rays R1-2 with the most disadvantageous angle of incidence have a location of incidence R1-A2 which is located further away from the center than in the case of a non-tilted substrate. This illustrates that the size of the non-irradiated regions behind the mirror substrates depends, inter alia, on the tilt angle and the angle of incidence spectrum.

The simulation or ray tracing also considers reflections of rays at side faces SF. To this end, the exemplary case considers the reflection at the side face SF—N of the immediately adjacent mirror substrate which is tilted to the right in the exemplary case. The ray R2 represents the most disadvantageous reflected ray which is incident on the side face SF—N, assumed to be reflective, at a relatively large angle of incidence (with more or less grazing incidence) and which is reflected from there in the direction of the base plane.

The point of incidence R2-A2 of this ray reflected once is located even further within the mirror substrate, i.e. closer to the center thereof, and as a result reduces the size of the region around the center which is not impinged directly by EUV radiation. The size of this region reduces with increasing tilt angles and increasing height of the mirror element above the base plane. Corresponding conditions arise on the opposite side and also on the other side faces of a mirror substrate.

Figures 14A, 14B:
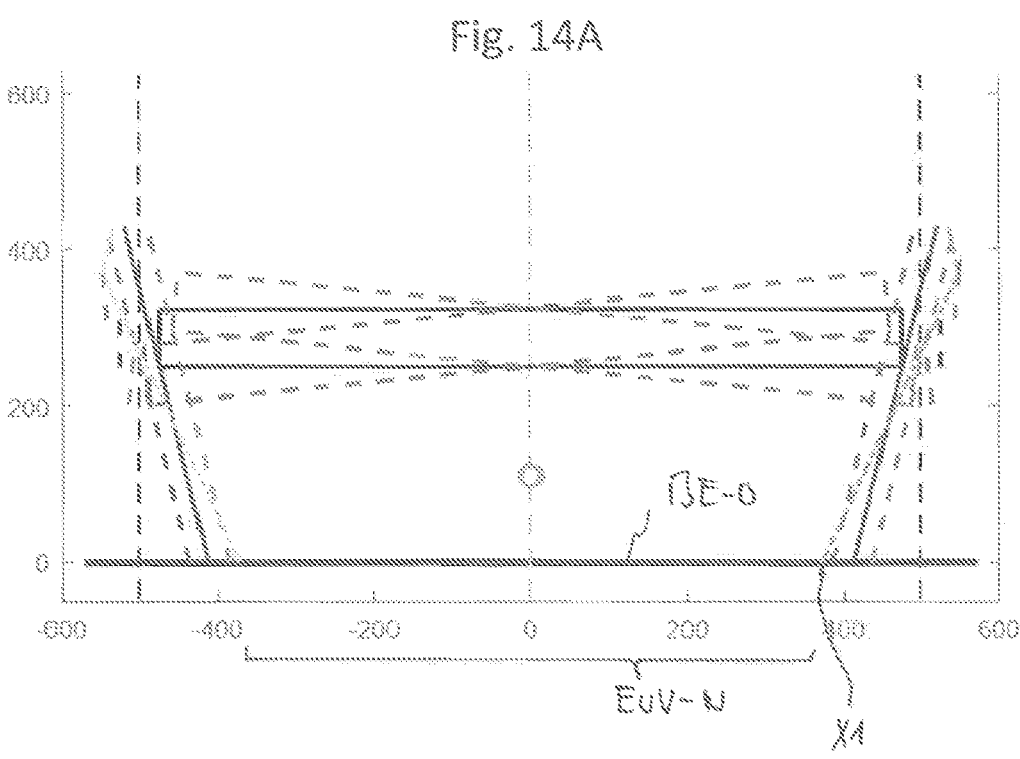
FIGS. 14A and 14B show a comparison of the irradiation conditions for conventional mirror elements with perpendicular side faces (FIG. 14A) and for an exemplary embodiment with oblique side faces (FIG. 14B).

This geometric model was used as a basis to examine, for a given angle of incidence range, the influence that the oblique position of side faces has on the size of the region below the mirror substrate which is not irradiated directly. FIG. 14A and FIG. 14B illustrate a comparison. In this case, FIG. 14A represents a conventional substrate with side faces directed perpendicular to the front face, while FIG. 14B illustrates the calculations on a substrate whose side faces are positioned obliquely by a few degrees (approx. 5°) and thereby recessed inwardly.

What arises for the given angle of incidence distribution in the case of a conventional substrate with perpendicular side faces (FIG. 14A) is that the outer edge of the region EUV-N located centrally behind the mirror substrate and not subject to any direct EUV irradiation is located at approx. 341 μm (corresponding to x-coordinate X1). By contrast, if the side faces are obliquely recessed inwardly (FIG. 14B), then this outer edge of the inner region EUV-N not directly exposed to the EUV radiation is displaced outwardly to approx. 359 μm (corresponding to x-coordinate X2>X1). Thus, the non-irradiatable region EUV-N becomes significantly larger than in the case of perpendicular side walls.

This result is representative of many examples with a suitable choice of the oblique position of the side faces and a typical angle of incidence distribution. Hence, the "reliable" dark area on the base element of the mirror unit is increased on account of the inwardly obliquely positioned side faces, and the regions below the gaps SP exposed to direct EUV or DUV radiation become smaller.

In the following text, reference is made to a further difference from the prior art. The front face VF, to which the reflection coating REF is applied, is prepared with high optical quality, for example by polishing, in order to obtain a surface roughness that is as low as possible. Typically, the surface roughness is in the range below 1 nm RMS (quadratic roughness); in particular, the surface roughness can be in the range below 0.2 nm RMS.

Even though the side faces SF are conventionally not etched with such great precision, the surface roughness may however be relatively low by all means, for example in the region of a few or a few ten nm RMS.

By contrast, the side faces SF of the exemplary embodiment are significantly roughened by way of suitable surface processing, with the result that the side faces are provided with a surface roughness which is greater than that of the front face VF by at least one order of magnitude, for example two or more orders of magnitude. For example, the surface roughness can be at least 100 nm RMS or even in the range above 1 μm RMS. Specular reflection cannot occur on surfaces that are so rough, even if they carry a coating with in principle a reflective effect. Such surfaces have a predominantly scattering effect on possibly incident EUV radiation.

Combinations of the type shown in FIG. 11, where the geometric measure of placing the side faces SF obliquely is combined with the roughening of the side faces, can be desirable in view of preventing EUV radiation from radiating directly behind the plane of the mirror surfaces. This further reduces the proportion of EUV radiation steered into the region behind the mirror substrates as a result of interacting with the side faces SF. In the process, some of the radiation energy can be absorbed in the side faces and another portion can be distributed over a relatively large solid angle range by scattering in that case, with the result that the locally effective intensity remains low. Hence, the risks on account of EUV radiation-induced issues of all types can be reduced.

Techniques known per se from the field of producing microelectromechanical systems (MEMS) can be used for the production of the mirror substrates with obliquely inwardly offset side faces. In particular, variants of deep reactive ion etching (DRIE, also known as the Bosch process) can be used to create appropriately deep trenches with oblique side walls in volume regions of a substrate material (in particular silicon) intended to serve as mirror substrates. Regarding the DRIE method, reference is made by way of example to the following publication: R Li, Y Lamy, W F A Besling, F Roozeboom, P M Sarro, "Continuous deep reactive ion etching of tapered via holes for three-dimensional integration", J. Micromech. Microeng. 18 (2008) 125023 doi:10.1088/0960-1317/18/12/125023.

Suitable DRIE methods comprise cycles with passivation and etching. For passivation, a hole can be protected by the deposition of Teflon-like passivation layers. In the etching steps, which may be highly anisotropic, ions are accelerated substantially vertically in order to remove the passivation material from the base of a trench, with the passivation on the sidewalls being maintained at the same time. Then, a few micrometers of substrate material (e.g. silicon) can be etched before the next passivation step occurs. The depth profile of the etched trenches can be set by various process parameters, such as gas flow, ion power, pressures, and the ratios between times of passivation and times of etching. Hence it is possible, inter alia, to also create trenches which are narrower or wider in the entrance region than at depth. Since such processes are known per se, an in-depth description of the production process is dispensed with.

What is claimed is:
1. A multi-mirror array, comprising:
a carrier structure; and
a multiplicity of mirror units next to one another and supported by the carrier structure in a grid arrangement, wherein:

each mirror unit comprises a base element and an individually movably mounted mirror element opposite the base element;

each mirror element comprises a mirror substrate;

each mirror substrate comprises:
a front face facing away from the base element;
a back face facing the base element; and
a side face facing a circumference of the mirror substrate;

each front face carries a reflection coating configured to reflect ultraviolet radiation and defining a mirror surface;

the array of mirror elements is configured so that a relative movement of the mirror elements with respect to one another is implementable without mutual collision in a movement range of the mirror elements;

the mirror surfaces are next to one another to substantially fill an area so that a gap is delimited by the side faces of immediately adjacent mirror substrates to ensure a collision-free relative movement of the adjacent mirror elements;

for each mirror unit, functional components of the mirror unit are in an intermediate space between the base element and the mirror element; and at least portions of each side face of the mirror substrates is oriented obliquely with respect to the assigned mirror surface at an angle that deviates from 90°.

2. The multi-mirror array of claim 1, further comprising:
a suspension system comprising components configured to movably mount the mirror element on the base element; and
an actuator system comprising components configured to create movements of the mirror element relative to the base element responsive to control signals,
wherein the components of the suspension system and the components of the actuator system are in an intermediate space between the base element and the mirror element.

3. The multi-mirror array of claim 1, wherein the side faces of mirror substrates of immediately adjacent mirror substrates are configured so that the gap between immediately adjacent mirror substrates has a gap width which in a direction from the front face to the base element.

4. The multi-mirror array of claim 1, wherein the front face of a mirror element has a greater surface area than an area enclosed by an outer edge of the back face, and the outer edge of the back face is inwardly recessed by a lateral offset in relation to an outer edge of the front face at all circumferential positions.

5. The multi-mirror array of claim 1, wherein an included angle at a transition between the front face and the adjacent side face is from 80° to 89°.

6. The multi-mirror array of claim 1, wherein the mirror substrates have a substantially trapezoidal cross-sectional form with a wider base on the side of the front face in a section between opposite side faces.

7. The multi-mirror array of claim 1, wherein the side faces have a surface roughness which is at least one order of magnitude greater than a surface roughness of the front face.

8. The multi-mirror array of claim 1, wherein the edge regions of mirror substrates of immediately adjacent mirror substrates are each oriented obliquely with respect to an assigned mirror surface at an angle deviating from 900 so that the oblique side faces delimit a gap oriented obliquely with respect to the mirror surfaces.

9. The multi-mirror array of claim 8, wherein the gap has a first gap opening with a first gap width adjacent to the mirror surfaces and a second gap opening with a second gap width adjacent to back sides of the mirror substrates, the first and the second gap openings having a lateral offset due to the oblique orientation of the gap so that an effective gap width for a direct radiation passage is smaller than the first gap width and/or the second gap width.

10. The multi-mirror array of claim 1, wherein the mirror substrates have a substantially trapezoidal cross-sectional form in a section guided between opposite side faces, with successive mirror elements in a row preferably having reversed trapezoidal cross-sectional form in alternation, with the result that the orientation of the interposed oblique gaps changes from gap to gap in alternation.

11. The multi-mirror array of claim 1, further comprising a controllable height adjustment device for the reversible, continuous height adjustment of individual mirror elements in relation to adjacent mirror elements.

12. The multi-mirror array of claim 11, further comprising a controller configured to control the height adjustment device so that a height adjustment of a mirror element is generatable depending on tilt positions of adjacent mirror elements.

13. The multi-mirror array of claim 1, further comprising radiation trap elements comprising a radiation incidence surface on the back side of the mirror substrates ces in the region of the gaps.

14. The multi-mirror array of claim 13, wherein portions of the radiation trap elements are height-adjustable.

15. The multi-mirror array of claim 1, further comprising a protective membrane which comprises a gap covering portion bridging a gap between immediately adjacent mirror substrates and contacting the mirror substrates delimiting the gap.

16. The multi-mirror array of claim 15, wherein the protective membrane comprises a material that absorbs EUV radiation.

17. The multi-mirror array of claim 15, wherein the protective membrane is on the front side of the mirror substrates between the mirror substrates and the reflection coating.

18. The multi-mirror array of claim 15, wherein at least one of the following holds:

the multi-mirror array further comprises a protective membrane on the back side of the mirror substrates;

the multi-mirror array further comprises a protective membrane between the back side of the mirror substrate and a back side of a radiation trap element; and the multi-mirror array further comprises a tilt position-dependent height adjustment of the radiation trap element via layer stress of the protective membrane, which is between the mirror unit and a radiation trap element.

19. The multi-mirror array of claim 1, further comprising a corrosion protection layer supported by a component of the mirror unit, wherein the component comprises a material, and the corrosion protection layer has a greater resistance to corrosion caused by hydrogen ions than the material of the component.

20. The multi-mirror array of claim 1, wherein the multi-mirror array comprises an EUV multi-mirror array.

21. An illumination system, comprising:

a multi-mirror array according to claim 1, wherein the illumination system is configured to: i) receive UV radiation from a UV radiation source; ii) shape illumination radiation from at least a portion of the received UV radiation during the operation of the UV apparatus; and iii) direct the illumination radiation at an illumination field in an exit plane of the illumination system.

* * * * *